United States Patent
Matsuzaki

(10) Patent No.: US 9,581,874 B2
(45) Date of Patent: Feb. 28, 2017

(54) SEMICONDUCTOR DEVICE

(71) Applicant: Semiconductor Energy Laboratory Co., Ltd., Atsugi-shi, Kanagawa-ken (JP)

(72) Inventor: Takanori Matsuzaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 335 days.

(21) Appl. No.: 14/190,278

(22) Filed: Feb. 26, 2014

(65) Prior Publication Data
US 2014/0240634 A1    Aug. 28, 2014

(30) Foreign Application Priority Data

Feb. 28, 2013  (JP) .................................. 2013-038083

(51) Int. Cl.
*G02F 1/1368* (2006.01)
*H01L 29/786* (2006.01)
(Continued)

(52) U.S. Cl.
CPC ........ *G02F 1/1368* (2013.01); *H01L 27/1225* (2013.01); *H01L 29/7869* (2013.01);
(Continued)

(58) Field of Classification Search
CPC ............... G02F 1/1368; G02F 1/13624; G02F 1/136286; H01L 27/1255; H01L 29/7869;
(Continued)

(56) References Cited

U.S. PATENT DOCUMENTS

| 4,466,081 A | 8/1984 | Masuoka |
| 4,609,986 A | 9/1986 | Hartmann et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Julio J Maldonado
*Assistant Examiner* — Farun Lu
(74) *Attorney, Agent, or Firm* — Fish & Richardson P.C.

(57) ABSTRACT

A semiconductor device capable of maintaining data even after instantaneous power reduction or interruption. The semiconductor device includes first to sixth transistors. The first and fourth transistors are p-channel transistors. The second and fifth transistors are n-channel transistors. In the third and sixth transistors, a channel formation region is included in an oxide semiconductor layer. A high voltage is applied to one of a source and a drain of the first transistor and one of a source and a drain of the fourth transistor. A low voltage is applied to one of a source and a drain of the second transistor and one of a source and a drain of the fifth transistor.

9 Claims, 15 Drawing Sheets

(51) Int. Cl.
*H01L 27/12* (2006.01)
*G02F 1/1362* (2006.01)
*G09G 3/3225* (2016.01)
*G09G 3/36* (2006.01)
*G09G 3/32* (2016.01)

(52) U.S. Cl.
CPC .... *H01L 29/78696* (2013.01); *G02F 1/13624* (2013.01); *G09G 3/3225* (2013.01); *G09G 3/3648* (2013.01); *G09G 2300/0819* (2013.01); *G09G 2300/0861* (2013.01); *G09G 2300/0876* (2013.01)

(58) Field of Classification Search
CPC ............ H01L 29/78696; G09G 3/3225; G09G 3/3648; G09G 2300/0819; G09G 2300/0861; G09G 2300/0876; G11C 7/06
See application file for complete search history.

(56) References Cited

U.S. PATENT DOCUMENTS

| | | |
|---|---|---|
| 4,642,487 A | 2/1987 | Carter |
| 4,870,302 A | 9/1989 | Freeman |
| 4,902,637 A | 2/1990 | Kondou et al. |
| 5,731,856 A | 3/1998 | Kim et al. |
| 5,744,864 A | 4/1998 | Cillessen et al. |
| 6,127,702 A | 10/2000 | Yamazaki et al. |
| 6,294,274 B1 | 9/2001 | Kawazoe et al. |
| 6,314,017 B1 | 11/2001 | Emori et al. |
| 6,563,174 B2 | 5/2003 | Kawasaki et al. |
| 6,727,522 B1 | 4/2004 | Kawasaki et al. |
| 6,781,865 B2 | 8/2004 | Ohtsuka et al. |
| 7,030,650 B1 | 4/2006 | Kaptanoglu et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,054,121 B2 | 11/2011 | Kato |
| 8,314,637 B2 | 11/2012 | Kato et al. |
| 8,339,828 B2 | 12/2012 | Yamazaki et al. |
| 8,339,836 B2 | 12/2012 | Yamazaki et al. |
| 8,362,538 B2 | 1/2013 | Koyama et al. |
| 8,593,856 B2 | 11/2013 | Koyama et al. |
| 2001/0046027 A1 | 11/2001 | Tai et al. |
| 2002/0008689 A1* | 1/2002 | Koyama ........ H03K 19/018578 345/100 |
| 2002/0056838 A1 | 5/2002 | Ogawa |
| 2002/0096702 A1 | 7/2002 | Ishii et al. |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0237786 A1 | 10/2005 | Atwood et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0047286 A1 | 3/2007 | Miki |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0280058 A1 | 11/2008 | Krunks et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0114918 A1 | 5/2009 | Wang et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0089417 A1 | 4/2011 | Yamazaki et al. |
| 2011/0101332 A1 | 5/2011 | Yamazaki et al. |
| 2011/0101351 A1 | 5/2011 | Yamazaki |
| 2011/0114945 A1 | 5/2011 | Yamazaki et al. |
| 2011/0121878 A1 | 5/2011 | Kato et al. |
| 2011/0122673 A1 | 5/2011 | Kamata et al. |
| 2011/0128777 A1 | 6/2011 | Yamazaki et al. |
| 2011/0134683 A1 | 6/2011 | Yamazaki et al. |
| 2011/0147737 A1 | 6/2011 | Yamazaki et al. |
| 2011/0156025 A1 | 6/2011 | Shionoiri et al. |
| 2011/0156027 A1 | 6/2011 | Yamazaki et al. |
| 2011/0156028 A1 | 6/2011 | Yamazaki et al. |
| 2011/0156117 A1 | 6/2011 | Yamazaki et al. |
| 2011/0157961 A1 | 6/2011 | Yamazaki et al. |
| 2011/0175083 A1 | 7/2011 | Sekine et al. |

(56) References Cited

U.S. PATENT DOCUMENTS

| | | | |
|---|---|---|---|
| 2011/0175087 A1 | 7/2011 | Yamazaki et al. | |
| 2011/0175104 A1 | 7/2011 | Yamazaki | |
| 2011/0175646 A1 | 7/2011 | Takemura et al. | |
| 2011/0176263 A1 | 7/2011 | Yamazaki et al. | |
| 2011/0176348 A1 | 7/2011 | Yamazaki et al. | |
| 2011/0176355 A1 | 7/2011 | Furutani et al. | |
| 2011/0176377 A1 | 7/2011 | Koyama | |
| 2011/0182110 A1 | 7/2011 | Yamazaki et al. | |
| 2011/0186837 A1 | 8/2011 | Takahashi et al. | |
| 2011/0187410 A1 | 8/2011 | Kato et al. | |
| 2011/0194327 A1 | 8/2011 | Kawae | |
| 2011/0194332 A1 | 8/2011 | Saito | |
| 2012/0161220 A1 | 6/2012 | Yamazaki | |
| 2012/0293200 A1 | 11/2012 | Takemura | |
| 2012/0293201 A1 | 11/2012 | Fujita et al. | |
| 2012/0293202 A1 | 11/2012 | Nishijima et al. | |
| 2012/0293203 A1 | 11/2012 | Ohmaru et al. | |
| 2012/0293206 A1 | 11/2012 | Yoneda et al. | |
| 2012/0293242 A1 | 11/2012 | Kato | |
| 2012/0299626 A1* | 11/2012 | Fujita | H03K 23/44 327/115 |
| 2012/0306533 A1 | 12/2012 | Ohmaru | |
| 2013/0020644 A1* | 1/2013 | Horita | G11C 11/412 257/351 |
| 2013/0223135 A1 | 8/2013 | Koyama | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-050208 A | 2/2006 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3-A2O3-BO

(56) References Cited

OTHER PUBLICATIONS

Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3-Ga2ZnO4-ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn—Oxide TFTs", IDW '09 : Proceedings of The 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of The 15th International Display Workshops, Dec. 3, 2008, pp. 1637-1640.
Tsuda.K et al., "Ultra Low Power Consumption Technologies for Mobile TFT-LCDs", IDW '02 : Proceedings of The 9th International Display Workshops, Dec. 4, 2002, pp. 295-298.

(56) References Cited

OTHER PUBLICATIONS

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

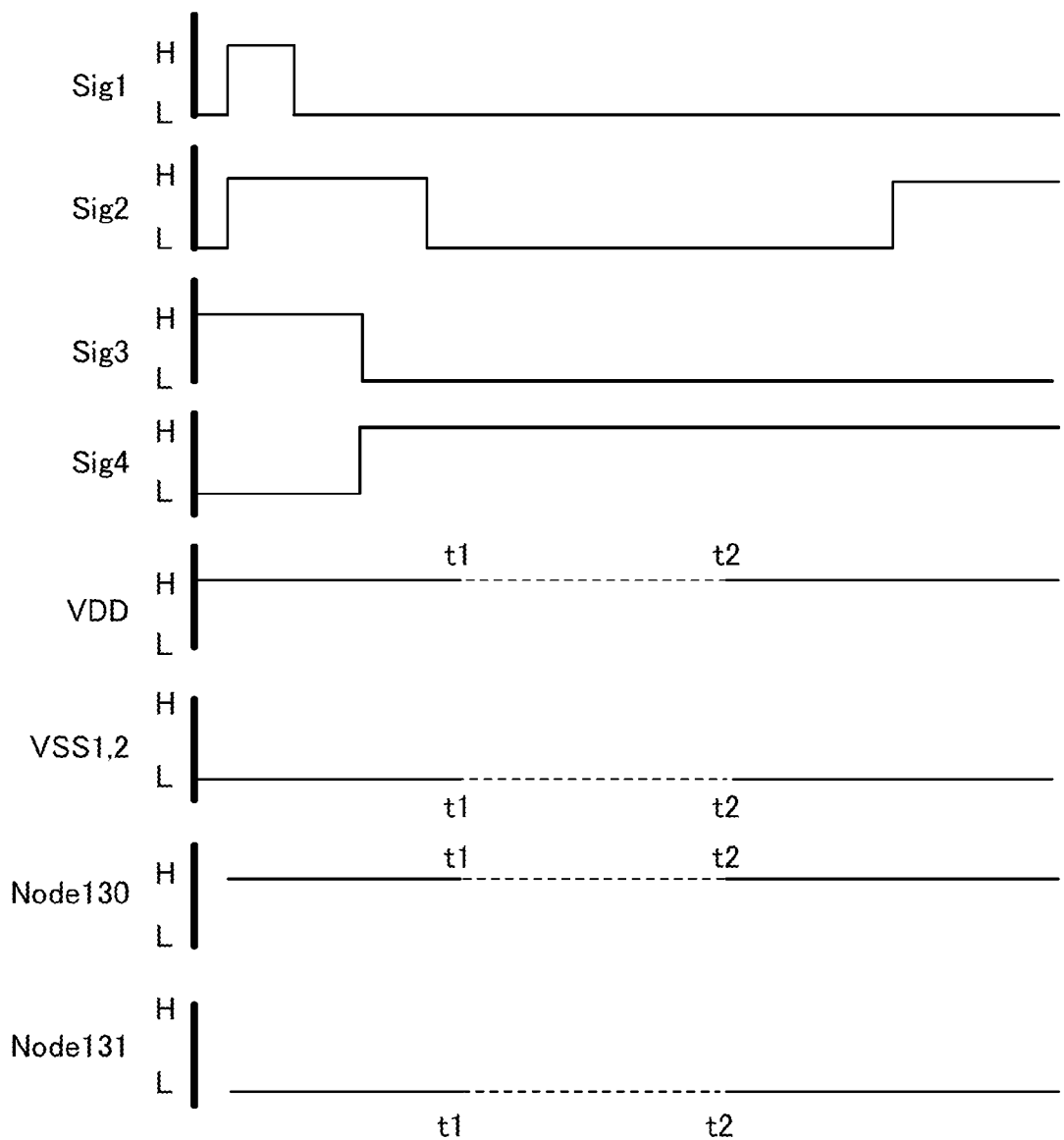

SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a driving method thereof, or a manufacturing method thereof. The present invention particularly relates to a semiconductor device, a display device, or a light-emitting device each including an oxide semiconductor, for example.

2. Description of the Related Art

Patent Document 1 discloses a logic circuit that maintains data even after instantaneous power reduction or interruption.

REFERENCE

Patent Document 1: Japanese Published Patent Application No. 2006-050208

SUMMARY OF THE INVENTION

An object of one embodiment of the present invention is to provide a semiconductor device including a circuit different from that in Patent Document 1. Another object of one embodiment of the present invention is to provide a high-quality semiconductor device or the like.

An object of one embodiment of the present invention is to provide a semiconductor device or the like with low off-state current. Another object of one embodiment of the present invention is to provide a semiconductor device or the like with low power consumption. Another object of one embodiment of the present invention is to provide an eye-friendly display device or the like. Another object of one embodiment of the present invention is to provide a semiconductor device or the like including a transparent semiconductor layer. Another object of one embodiment of the present invention is to provide a semiconductor device or the like including a semiconductor layer with high reliability.

Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first transistor, a second transistor, a third transistor, a fourth transistor, a fifth transistor, and a sixth transistor. The first transistor and the fourth transistor are p-channel transistors. The second transistor and the fifth transistor are n-channel transistors. The third transistor includes an oxide semiconductor layer including a region where a channel is formed (hereinafter referred to as channel formation region). The sixth transistor includes an oxide semiconductor layer including a channel formation region. A high voltage is applied to one of a source and a drain of the first transistor. A low voltage is applied to one of a source and a drain of the second transistor. The other of the source and the drain of the first transistor is electrically connected to the other of the source and the drain of the second transistor and one of a source and a drain of the third transistor. The other of the source and the drain of the third transistor is electrically connected to a gate of the fourth transistor and a gate of the fifth transistor. The high voltage is applied to one of a source and a drain of the fourth transistor. The low voltage is applied to one of a source and a drain of the fifth transistor. The other of the source and the drain of the fourth transistor is electrically connected to the other of the source and the drain of the fifth transistor and one of a source and a drain of the sixth transistor. The other of the source and the drain of the sixth transistor is electrically connected to a gate of the first transistor and a gate of the second transistor.

In the semiconductor device of one embodiment of the present invention, the channel formation region of each of the third and sixth transistors is included in the oxide semiconductor layer. Thus, even if the high voltage and the low voltage are temporarily interrupted, a voltage between the other of the source and the drain of the first transistor and the other of the source and the drain of the second transistor can be recovered when the high voltage and the low voltage are recovered. Moreover, a voltage between the other of the source and the drain of the fourth transistor and the other of the source and the drain of the fifth transistor can be recovered.

One embodiment of the present invention is a semiconductor device including a first resistor, a second resistor, a first transistor, a second transistor, a third transistor, and a fourth transistor. The first transistor and the third transistor are n-channel transistors. The second transistor includes an oxide semiconductor layer including a channel formation region. The fourth transistor includes an oxide semiconductor layer including a channel formation region. A high voltage is applied to one terminal of the first resistor. A low voltage is applied to one of a source and a drain of the first transistor. The other terminal of the first resistor is electrically connected to the other of the source and the drain of the first transistor and one of a source and a drain of the second transistor. The other of the source and the drain of the second transistor is electrically connected to a gate of the third transistor. The high voltage is applied to one terminal of the second resistor. The low voltage is applied to one of a source and a drain of the third transistor. The other terminal of the second resistor is electrically connected to the other of the source and the drain of the third transistor and one of a source and a drain of the fourth transistor. The other of the source and the drain of the fourth transistor is electrically connected to a gate of the first transistor.

In the semiconductor device of one embodiment of the present invention, the channel formation region of each of the second and fourth transistors is included in the oxide semiconductor layer. Thus, even if the high voltage and the low voltage are temporarily interrupted, a voltage between the other terminal of the first resistor and the other of the source and the drain of the first transistor can be recovered when the high voltage and the low voltage are recovered. Moreover, a voltage between the other terminal of the second resistor and the other of the source and the drain of the third transistor can be recovered.

One embodiment of the present invention is a semiconductor device including a first resistor, a second resistor, a first transistor, a second transistor, a third transistor, and a fourth transistor. The first transistor and the third transistor are p-channel transistors. The second transistor includes an oxide semiconductor layer including a channel formation region. The fourth transistor includes an oxide semiconductor layer including a channel formation region. A high voltage is applied to one of a source and a drain of the first transistor. A low voltage is applied to one terminal of the first resistor. The other of the source and the drain of the first transistor is electrically connected to the other terminal of the first resistor and one of a source and a drain of the second transistor. The other of the source and the drain of the second transistor is electrically connected to a gate of the third transistor. The high voltage is applied to one of a source and a drain of the third transistor. The low voltage is applied to one terminal of the second resistor. The other terminal of the second resistor is electrically connected to the other of the source and the drain of the third transistor and one of a source and a drain of the fourth transistor. The other of the source and the drain of the fourth transistor is electrically connected to a gate of the first transistor.

In the semiconductor device of one embodiment of the present invention, the channel formation region of each of the second and fourth transistors is included in the oxide semiconductor layer. Thus, even if the high voltage and the low voltage are temporarily interrupted, a voltage between the other of the source and the drain of the first transistor and the other terminal of the first resistor can be recovered when the high voltage and the low voltage are recovered. Moreover, a voltage between the other of the source and the drain of the third transistor and the other terminal of the second resistor can be recovered.

In the semiconductor device of one embodiment of the present invention, since the channel formation region of some of the transistors is included in the oxide semiconductor layer, even if the high voltage and the low voltage are temporarily interrupted, the original state can be recovered when the high voltage and the low voltage are recovered. In other words, data can be maintained even after instantaneous power reduction or interruption.

BRIEF DESCRIPTION OF THE DRAWINGS

In the accompanying drawings,

FIG. 2 is a timing chart;

DETAILED DESCRIPTION OF THE INVENTION

Figure 1A:
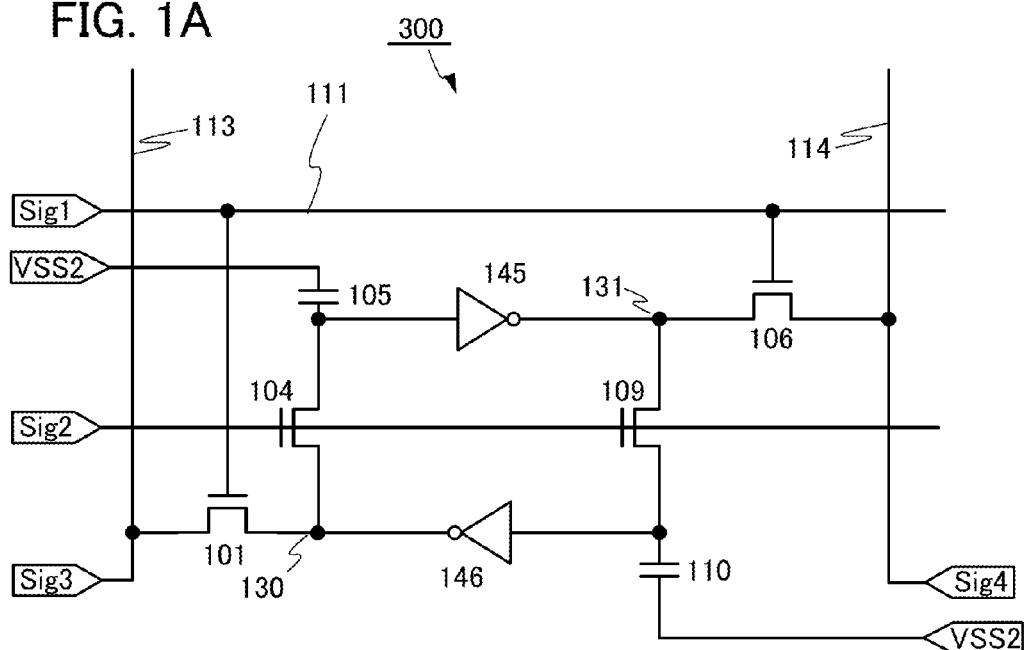
FIGS. 1A and 1B are circuit diagrams of a semiconductor device.

Embodiments of the present invention will be described below with reference to the drawings. Note that the present invention is not limited to the following description. It will be readily appreciated by those skilled in the art that various changes and modifications are possible without departing from the spirit and scope of the present invention. Therefore, the present invention should not be construed as being limited to the following description of the embodiments. Note that in describing structures of the present invention with reference to the drawings, reference numerals denoting the same portions are used in common in different drawings.

In this specification, the term "connection" means electrical connection and corresponds to the state in which current, voltage, or a potential can be supplied or transmitted. Therefore, a connection state means not only a state of direct connection but also a state of indirect connection through a circuit element such as a wiring, a resistor, a diode, or a transistor in which current, voltage, or a potential can be supplied or transmitted.

In a block diagram attached to this specification, components are classified according to their functions and shown as independent blocks; however, it is practically difficult to completely separate the components according to their functions, and one component may have a plurality of functions.

Note that a "source" of a transistor means a source region that is part of a semiconductor film functioning as an active layer or a source electrode electrically connected to the semiconductor film. Similarly, a "drain" of a transistor means a drain region that is part of a semiconductor film functioning as an active layer or a drain electrode electrically connected to the semiconductor film. A "gate" means a gate electrode.

The terms "source" and "drain" of a transistor interchange with each other depending on the type of the channel of the transistor or the levels of potentials applied to the terminals. In general, in an n-channel transistor, a terminal to which a lower potential is applied is called a source, and a terminal to which a higher potential is applied is called a drain. Further, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

In this specification, the term "parallel" indicates that the angle formed between two straight lines ranges from −10° to 10°, and accordingly also includes the case where the angle ranges from −5° to 5°. In addition, the term "perpendicular" indicates that the angle formed between two straight lines ranges from 80° to 100°, and accordingly includes the case where the angle ranges from 85° to 95°.

In this specification, trigonal and rhombohedral crystal systems are included in a hexagonal crystal system.

Embodiment 1

Figure 1B:
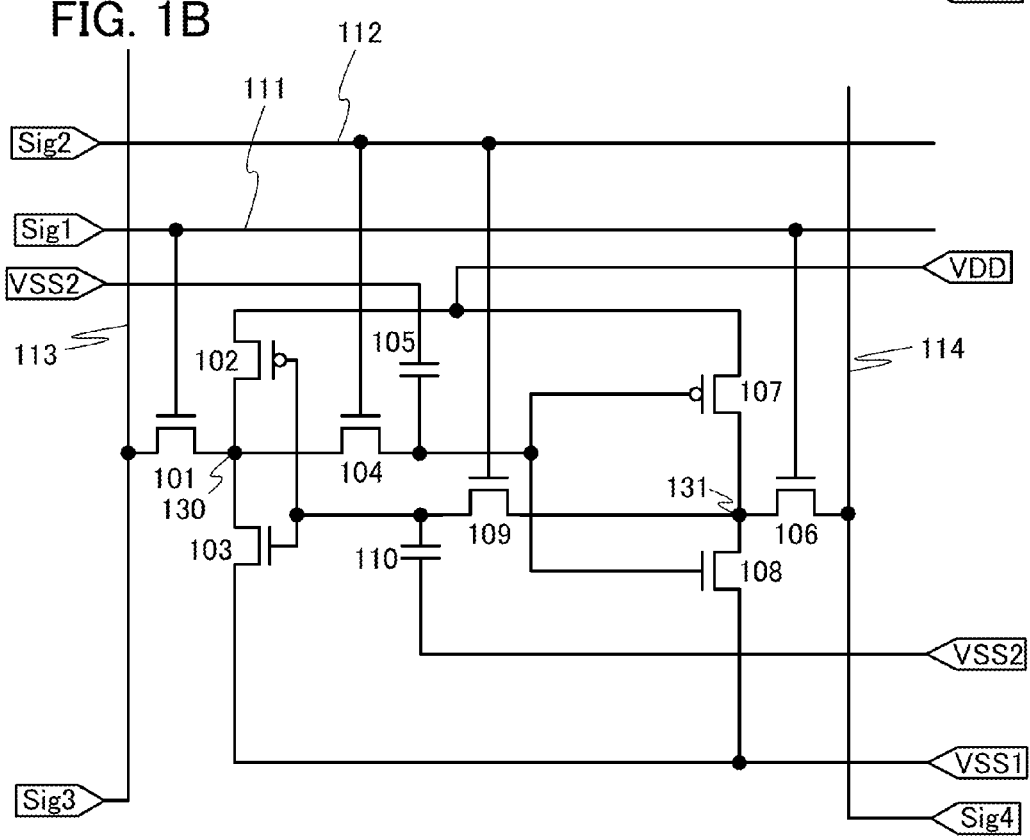

FIGS. 1A and 1B illustrate a semiconductor device 300. The semiconductor device 300 includes a transistor 101, an inverter 145, a transistor 104, a capacitor 105, a transistor 106, an inverter 146, a transistor 109, and a capacitor 110. The inverter 146 includes a transistor 102 and a transistor 103. The inverter 145 includes a transistor 107 and a transistor 108. In the transistors 104 and 109, an oxide semiconductor layer includes a channel formation region. Thus, data can be restored in the semiconductor device 300 if power supply is interrupted. Note that the transistors 101 and 106 are switches for controlling input or output of signals and are provided as needed. The capacitors 105 and 110 are provided as needed.

A signal Sig1 is input to a gate of the transistor 101 from a wiring 111.

A signal Sig3 is input to one of a source and a drain of the transistor 101 from a wiring 113.

The other of the source and the drain of the transistor 101 is electrically connected to an output of the inverter 146 and one of a source and a drain of the transistor 104.

An input of the inverter 146 is electrically connected to a drain of the transistor 109 and one electrode of the capacitor 110.

A voltage VDD is applied to one of a source and a drain of the transistor 102. Note that the voltage VDD is a high voltage and is higher than a voltage VSS1 and a voltage VSS2. One of the source and the drain of the transistor 102 is electrically connected to one of a source and a drain of the transistor 107.

The voltage VSS1 is applied to one of a source and a drain of the transistor 103. The voltage VSS1 is a low voltage and is lower than the voltage VDD. The voltage VSS1 may be a reference potential. One of the source and the drain of the transistor 103 is electrically connected to one of a source and a drain of the transistor 108. Here, the voltages of the wirings and the terminals are relative to each other, and whether each voltage is higher or lower than a given reference voltage is an important factor. Thus, the term "GND" is not limited to 0 V. The same applies to the drawings, and GND in the drawings does not necessarily mean 0 V. Although one electrode of a capacitor is grounded in some drawings, it may be electrically connected to a power supply line of VSS or VDD because such connection relation does not prevent voltage retention.

The output of the inverter 146 is electrically connected to the other of the source and the drain of the transistor 101 and one of the source and the drain of the transistor 104.

The channel of the transistor 104 is included in the oxide semiconductor layer; thus, the off-state current of the transistor 104, that is, the leakage current of the transistor 104 in an off state is extremely low.

A signal Sig2 is input to a gate of the transistor 104 from a wiring 112.

The other of the source and the drain of the transistor 104 is electrically connected to an input of the inverter 145 and one electrode of the capacitor 105.

The voltage VSS2 is applied to the other electrode of the capacitor 105. The voltage VSS2 is a low voltage and is lower than the voltage VDD. The voltage VSS2 may be a reference potential. The other electrode of the capacitor 105 is electrically connected to the other electrode of the capacitor 110. Note that the other electrode of the capacitor 105 may be electrically connected to a wiring different from VSS2, for example, a wiring to which the voltage VDD, the voltage VSS1, or the voltage GND can be supplied. The same applies to the other electrode of the capacitor 110. It is preferable that the other electrode of the capacitor 105 and the other electrode of the capacitor 110 be electrically connected to the same wiring because the number of wirings can be reduced. However, one embodiment of the present invention is not limited to this, and these electrodes can be connected to different wirings. For example, the other electrode of the capacitor 105 can be electrically connected to a wiring supplied with VSS2, and the other electrode of the capacitor 110 can be electrically connected to a wiring supplied with VDD.

The signal Sig1 is input to a gate of the transistor 106 from the wiring 111. Note that the gate of the transistor 101 is also electrically connected to the wiring 111. Electrically connecting the two gates to the same wiring can reduce the number of wirings. However, one embodiment of the present invention is not limited to this, and the wiring 111 can be divided into two separate wirings and the two wirings can be electrically connected to the respective gates of the transistors 101 and 106. Electrically connecting the two gates to different wirings enables different signals to be supplied to the gates, thereby offering greater flexibility in controlling timing.

A signal Sig4 is input to one of a source and a drain of the transistor 106 from a wiring 114. The signal Sig4 is low when the signal Sig3 is high, whereas the signal Sig4 is high when the signal Sig3 is low.

When the semiconductor device 300 is used for a memory cell, the wiring 113 serves as a bit line and the wiring 114 serves as an inverted bit line. Accordingly, the states of a node 130 and a node 131 can be output to the bit line and the inverted bit line.

The other of the source and the drain of the transistor 106 is electrically connected to an output of the inverter 145 and one of the source and the drain of the transistor 109.

The input of the inverter 145 is electrically connected to the other of the source and the drain of the transistor 104 and the one electrode of the capacitor 105.

The voltage VDD is applied to one of the source and the drain of the transistor 107.

The voltage VSS1 is applied to one of the source and the drain of the transistor 108.

The output of the inverter 145 is electrically connected to the other of the source and the drain of the transistor 106 and one of the source and the drain of the transistor 109.

The channel of the transistor 109 is included in the oxide semiconductor layer; thus, the off-state current of the transistor 109, that is, the leakage current of the transistor 109 in an off state is extremely low.

The signal Sig2 is input to a gate of the transistor 109 from the wiring 112. Note that the gate of the transistor 104 is also electrically connected to the wiring 112. Electrically connecting the two gates to the same wiring can reduce the number of wirings. However, one embodiment of the present invention is not limited to this, and the wiring 112 can be divided into two separate wirings and the two wirings can be electrically connected to the respective gates of the transistors 104 and 109. Electrically connecting the two gates to different wirings enables different signals to be supplied to the gates, thereby offering greater flexibility in controlling timing.

The other of the source and the drain of the transistor 109 is electrically connected to the input of the inverter 146 and the one electrode of the capacitor 110.

The voltage VSS2 is applied to the other electrode of the capacitor 110.

The transistors 102 and 107 are p-channel transistors, and the transistors 103 and 108 are n-channel transistors. Although the transistors 101, 104, 106, and 109 can be either an n-channel transistor or a p-channel transistor, the case of using n-channel transistors will be described below.

An example of the operation of the semiconductor device 300 will be described. FIG. 2 is a timing chart. Although the voltage VSS1 and the voltage VSS2 are the same voltage in FIG. 2, they are not necessarily the same voltage.

The signal Sig1 (high signal) is input to the gate of the transistor 101 and the gate of the transistor 106. The transistors 101 and 106 are turned on.

The signal Sig2 (high signal) is input to the gate of the transistor 104 and the gate of the transistor 109. The transistors 104 and 109 are turned on.

The signal Sig3 (high signal) is input to one of the source and the drain of the transistor 101. The node 130 becomes high. Since the transistor 104 is on, the high signal is input to a gate of the transistor 107, a gate of the transistor 108, and the one electrode of the capacitor 105. As a result, the transistor 107 is turned off and the transistor 108 is turned on.

The transistor 106 is on, and the signal Sig4 (low signal) is input to one of the source and the drain of the transistor 106. The node 131 becomes low. Since the transistor 109 is on, the low signal is input to a gate of the transistor 102, a gate of the transistor 103, and the one electrode of the capacitor 110. Thus, the transistor 102 is turned on and the transistor 103 is turned off.

Accordingly, the node 130 becomes high and the node 131 becomes low; thus, a write operation is completed.

Next, the transistors 101 and 106 are turned off by the signal Sig1. Since the transistor 102 is on and the transistor 103 is off at this time, the node 130 is supplied with the voltage VDD and remains high. On the other hand, since the transistor 108 is on and the transistor 107 is off, the node 131 is supplied with the voltage VSS1 and remains low.

Then, the transistors 104 and 109 are turned off by the signal Sig2. The transistor 102 remains on and the transistor 103 remains off because the low signal is supplied to the gate of the transistor 102 and the gate of the transistor 103. The transistor 107 remains off and the transistor 108 remains on because the high signal is supplied to the gate of the transistor 107 and the gate of the transistor 108.

Assuming that the voltage VDD, the voltage VSS1, and the voltage VSS2 are temporarily lowered or interrupted at time t1, the states held at the nodes 130 and 131 are lost. At this time, the transistors 104 and 109 are off because of the signal Sig2. Since the off-state current of the transistors 104 and 109 is extremely low, the transistors 102 and 108 remain on and the transistors 103 and 107 remain off.

Then, assuming that the voltage VDD, the voltage VSS1, and the voltage VSS2 are recovered at time t2, the node 130 becomes high and the node 131 becomes low because the transistors 102 and 108 are on.

Accordingly, the states of the nodes 130 and 131 are recovered. In the semiconductor device 300, data can be restored if the voltage VDD, the voltage VSS1, and the voltage VSS2 are interrupted.

Note that the transistors 102 and 107 may be resistors. The semiconductor device 300 illustrated in FIG. 3 includes a resistor 120 and a resistor 121 instead of the transistor 102 and the transistor 107, respectively.

The voltage VDD is applied to one terminal of the resistor 120. The other terminal of the resistor 120 is electrically connected to the other of the source and the drain of the transistor 101, one terminal of the resistor 121, the other of the source and the drain of the transistor 103, and one of the source and the drain of the transistor 104.

The voltage VDD is applied to the one terminal of the resistor 121. The other terminal of the resistor 121 is electrically connected to the other of the source and the drain of the transistor 106, the other of the source and the drain of the transistor 108, and one of the source and the drain of the transistor 109.

Figure 3:
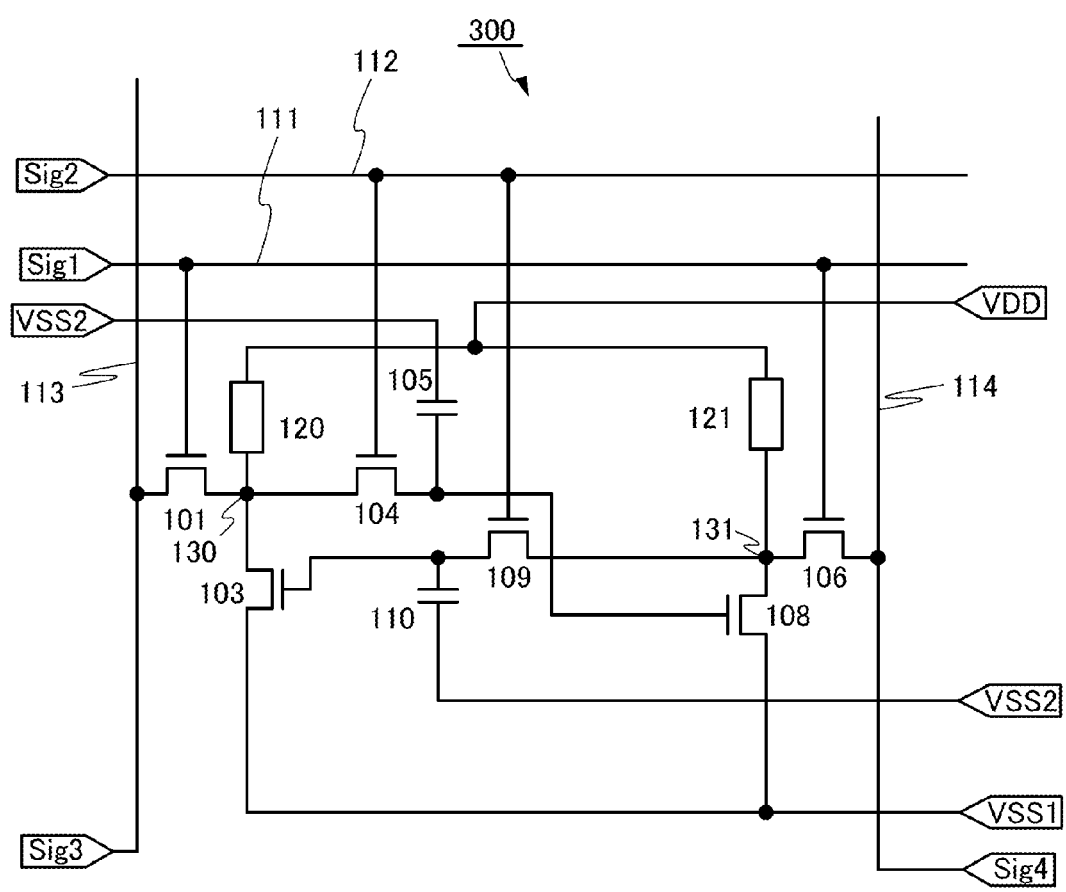
FIG. 3 is a circuit diagram of a semiconductor device.

The operation of the semiconductor device 300 in FIG. 3 is similar to that of the semiconductor device 300 in FIGS. 1A and 1B; therefore, the detailed description is omitted here.

Alternatively, the transistors 103 and 108 may be resistors. A semiconductor device 320 illustrated in FIG. 4 includes a resistor 122 and a resistor 123 instead of the transistor 103 and the transistor 108, respectively.

The voltage VSS1 is applied to one terminal of the resistor 122. The one terminal of the resistor 122 is electrically connected to one terminal of the resistor 123. The other terminal of the resistor 122 is electrically connected to the other of the source and the drain of the transistor 101, the other of the source and the drain of the transistor 102, and one of the source and the drain of the transistor 104.

The voltage VSS1 is applied to the one terminal of the resistor 123. The other terminal of the resistor 123 is electrically connected to the other of the source and the drain of the transistor 106, the other of the source and the drain of the transistor 107, and one of the source and the drain of the transistor 109.

Figure 4:
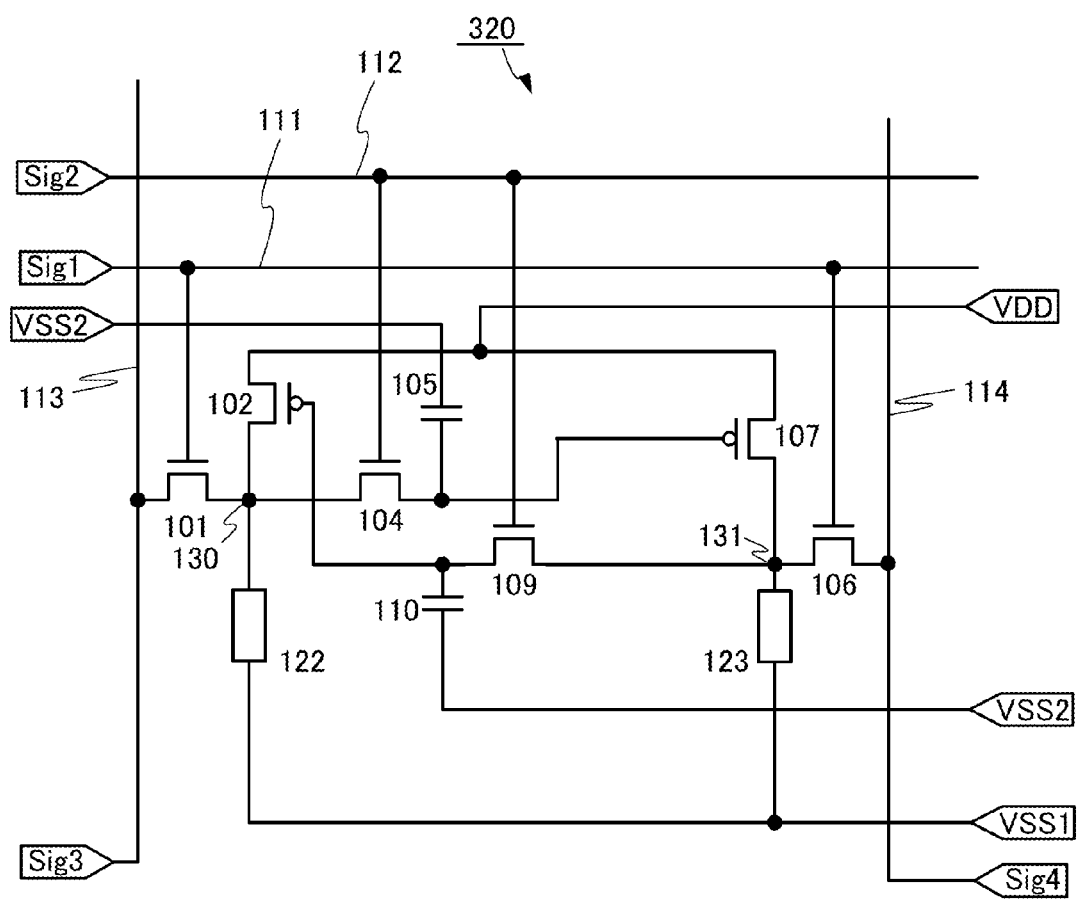
FIG. 4 is a circuit diagram of a semiconductor device.

The operation of the semiconductor device 320 in FIG. 4 is similar to that of the semiconductor device 300 in FIGS. 1A and 1B; therefore, the detailed description is omitted here.

This embodiment can be combined with any other embodiment as appropriate.

Embodiment 2

Figure 5:
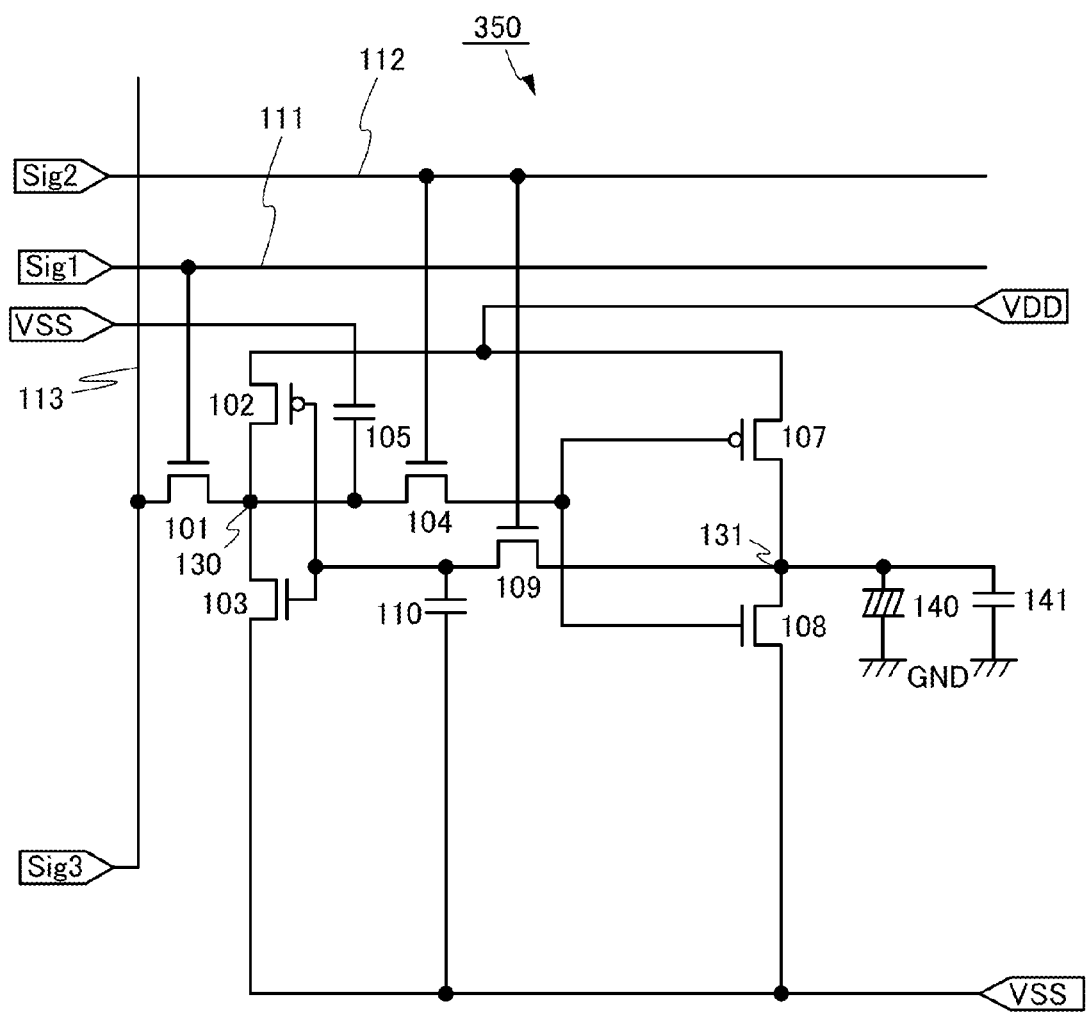
FIG. 5 is a circuit diagram of a semiconductor device.

FIG. 5 illustrates a semiconductor device 350. The semiconductor device 350 includes the transistor 101, the transistor 102, the transistor 103, the transistor 104, the capacitor 105, the transistor 107, the transistor 108, the transistor 109, the capacitor 110, a liquid crystal element 140, and a capacitor 141. The semiconductor device 350 is a liquid crystal display device. A channel formation region of each of the transistors 104 and 109 is included in an oxide semiconductor layer. Thus, if power supply is interrupted in the semiconductor device 350, the state of the liquid crystal element 140 can be recovered. Note that the capacitors 105 and 110 are provided as needed.

The semiconductor device 350 differs from the semiconductor device 300 (FIG. 1B) in not including the transistor 106 and in including the liquid crystal element 140 and the capacitor 141. Moreover, in the semiconductor device 350, a voltage VSS is applied to the other electrode the capacitor 105, the other electrode the capacitor 110, one of the source and the drain of the transistor 103, and one of the source and the drain of the transistor 108. The voltage VSS is a low voltage and is lower than the voltage VDD. The voltage VSS may be a reference potential. Here, the voltage GND is applied to a counter electrode of the liquid crystal element 140. When GND is an intermediate or nearly intermediate voltage between the voltage VDD and the voltage VSS, a positive signal and a negative signal can be supplied to the liquid crystal element 140, whereby the liquid crystal element 140 can be driven by an inversion scheme.

Figure 6:
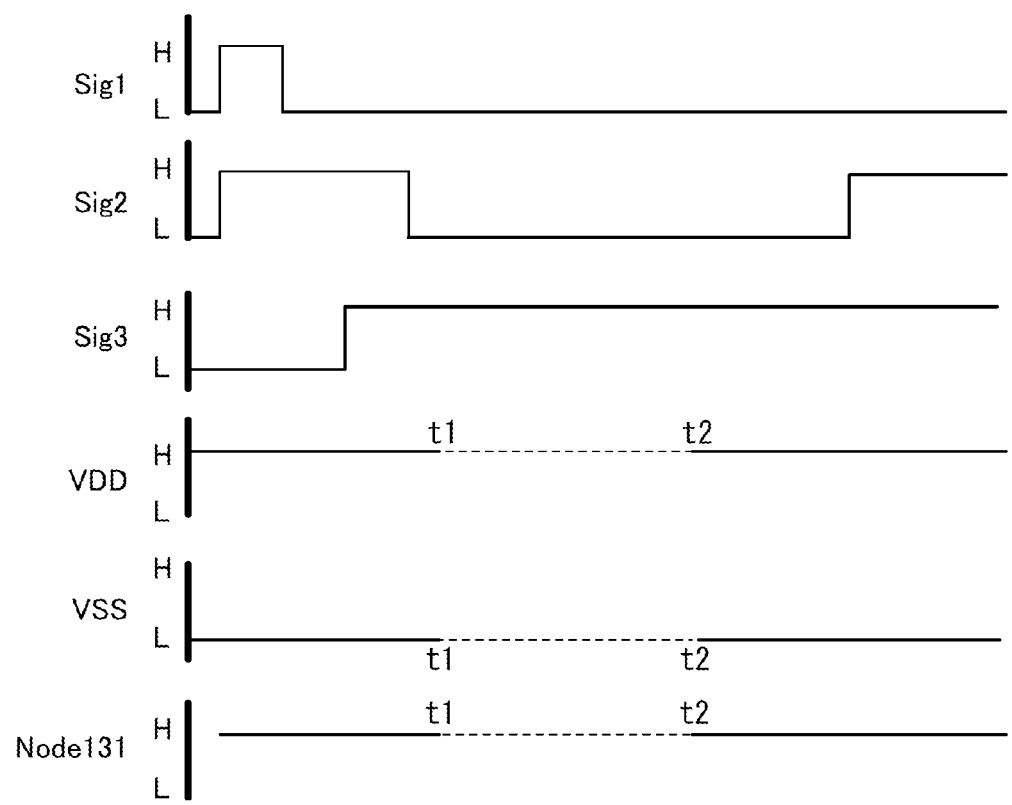
FIG. 6 is a timing chart.

An example of the operation of the semiconductor device 350 will be described. FIG. 6 is a timing chart.

The signal Sig1 (high signal) is input to the gate of the transistor 101. The transistor 101 is turned on.

The signal Sig2 (high signal) is input to the gate of the transistor 104 and the gate of the transistor 109. The transistors 104 and 109 are turned on.

The signal Sig3 (low signal) is input to one of the source and the drain of the transistor 101. The node 130 becomes low. Since the transistor 104 is on, the low signal is input to the gate of the transistor 107 and the gate of the transistor 108, so that the transistor 107 is turned on and the transistor 108 is turned off. The node 131 becomes high.

Since the transistor 109 is on, the high signal is input to the gate of the transistor 102, the gate of the transistor 103, and the one electrode of the capacitor 110. Thus, the transistor 102 is turned off and the transistor 103 is turned on.

The high signal is input to the one electrode of the liquid crystal element 140, and a voltage is applied to the liquid crystal element 140. The high signal is also input to the one electrode of the capacitor 141, and charge is stored in the capacitor 141.

Assuming that the voltage VDD and the voltage VSS are temporarily lowered or interrupted at time t1, the states held at the nodes 130 and 131 are lost. At this time, the transistors 104 and 109 are off because of the signal Sig2. Since the off-state current of the transistors 104 and 109 is extremely low, the transistors 102 and 108 remain off and the transistors 103 and 107 remain on.

Then, assuming that the voltage VDD and the voltage VSS are recovered at time t2, the voltage VDD is applied to the node 131 because the transistor 107 is on, and the node 131 becomes high. The high signal is input to the one electrode of the liquid crystal element 140, and a voltage is applied to the liquid crystal element 140.

Accordingly, the state of the liquid crystal element 140 is recovered.

Note that the transistors 102 and 107 may be resistors. A semiconductor device 351 illustrated in FIG. 7 includes the resistor 120 and the resistor 121 instead of the transistor 102 and the transistor 107, respectively.

Alternatively, the transistors 103 and 108 may be resistors. A semiconductor device 352 illustrated in FIG. 8 includes the resistor 122 and the resistor 123 instead of the transistor 103 and the transistor 108, respectively.

Figure 7:
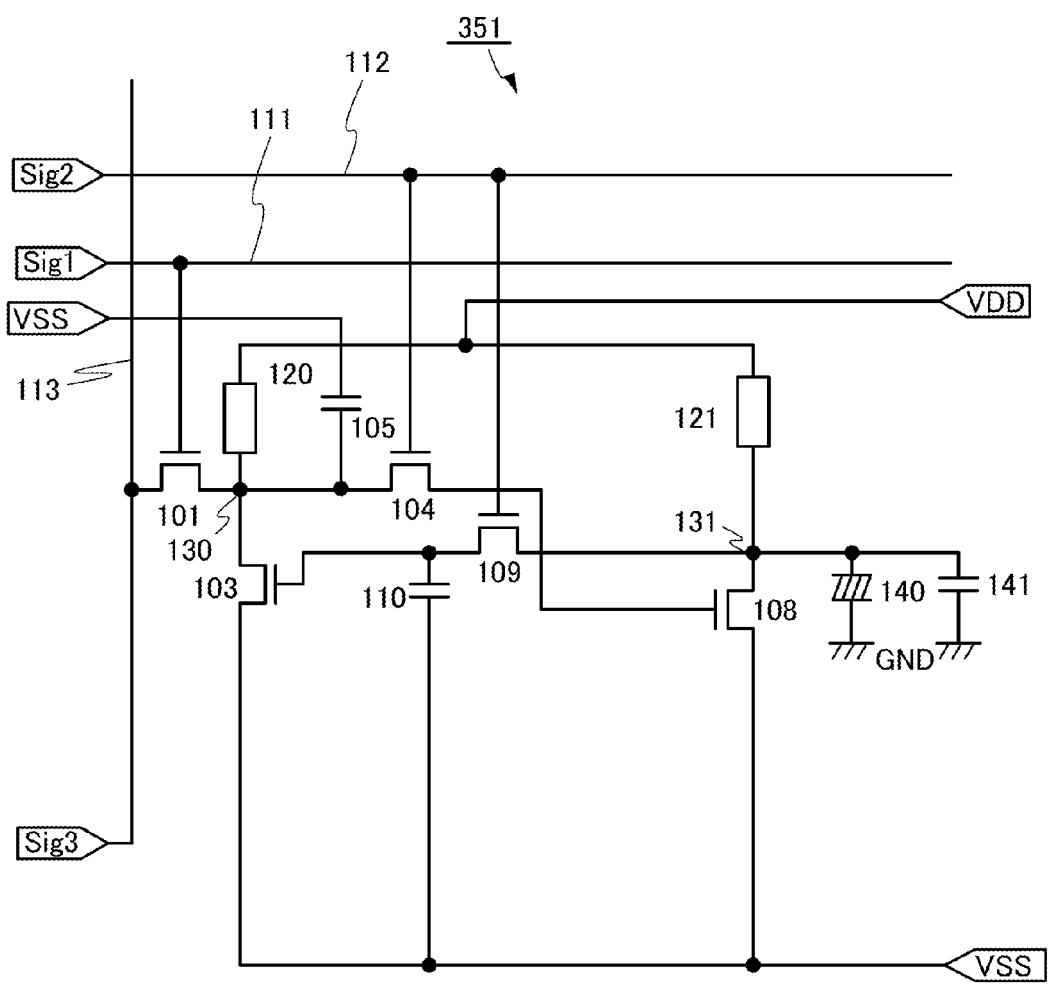
FIG. 7 is a circuit diagram of a semiconductor device.
Figure 8:
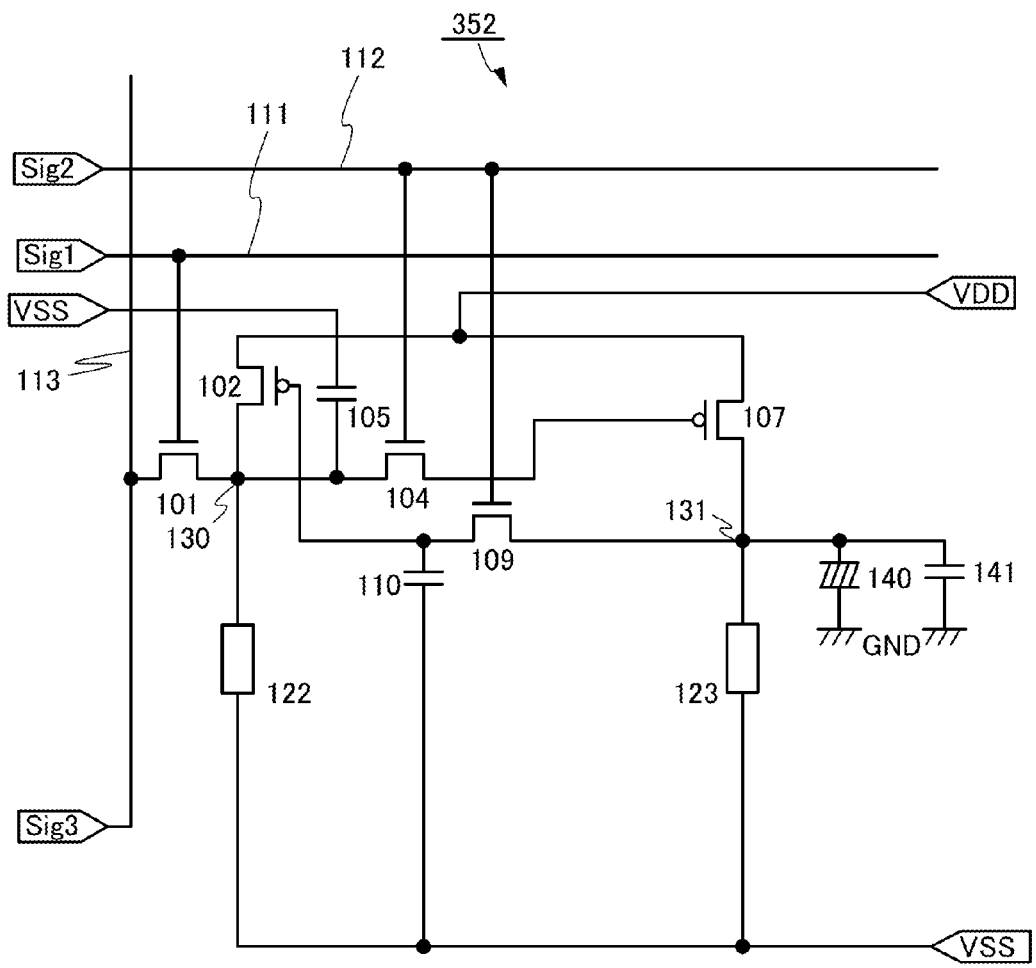
FIG. 8 is a circuit diagram of a semiconductor device.

The operations of the semiconductor device 351 in FIG. 7 and the semiconductor device 352 in FIG. 8 are similar to the operation of the semiconductor device 350 in FIG. 5; therefore, the detailed description is omitted here.

Figure 9:
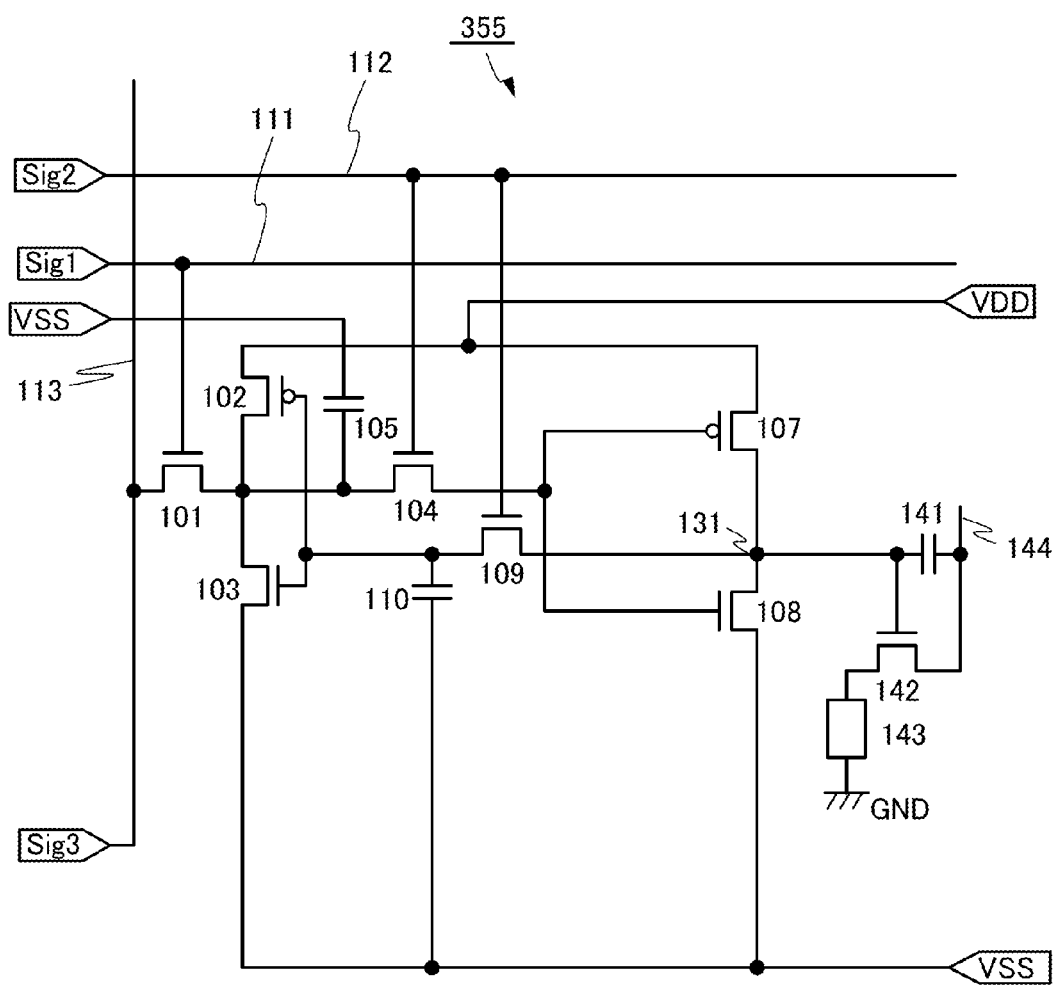
FIG. 9 is a circuit diagram of a semiconductor device.

FIG. 9 illustrates a semiconductor device 355. The semiconductor device 355 includes the transistor 101, the transistor 102, the transistor 103, the transistor 104, the capacitor 105, the transistor 107, the transistor 108, the transistor 109, the capacitor 110, a transistor 142, an EL element 143, and the capacitor 141. The semiconductor device 355 is an EL display device. A current is supplied to the EL element 143 from a wiring 144. Note that the transistor 142 may be electrically connected to a wiring having a function of supplying the voltage VDD, instead of the wiring 144. Similarly, the EL element 143 may be electrically connected to a wiring having a function of supplying the voltage VSS, instead of a wiring having a function of supplying the voltage GND.

The operation of the semiconductor device 355 is similar to that of the semiconductor device 350. When the node 131 becomes high, the high signal is input to a gate of the transistor 142 and one electrode of the capacitor 141. The transistor 142 is turned on and a current is supplied to the EL element 143 from the wiring 144, so that electroluminescence is obtained.

In the semiconductor device 355, when the voltage VDD and the voltage VSS are interrupted and then recovered, the node 131 becomes high. Accordingly, the state of the EL element 143 is recovered.

Note that the transistors 102 and 107 may be resistors. A semiconductor device 356 illustrated in FIG. 10 includes the resistor 120 and the resistor 121 instead of the transistor 102 and the transistor 107, respectively.

Alternatively, the transistors 103 and 108 may be resistors. A semiconductor device 357 illustrated in FIG. 11 includes the resistor 122 and the resistor 123 instead of the transistor 103 and the transistor 108, respectively.

Figure 10:
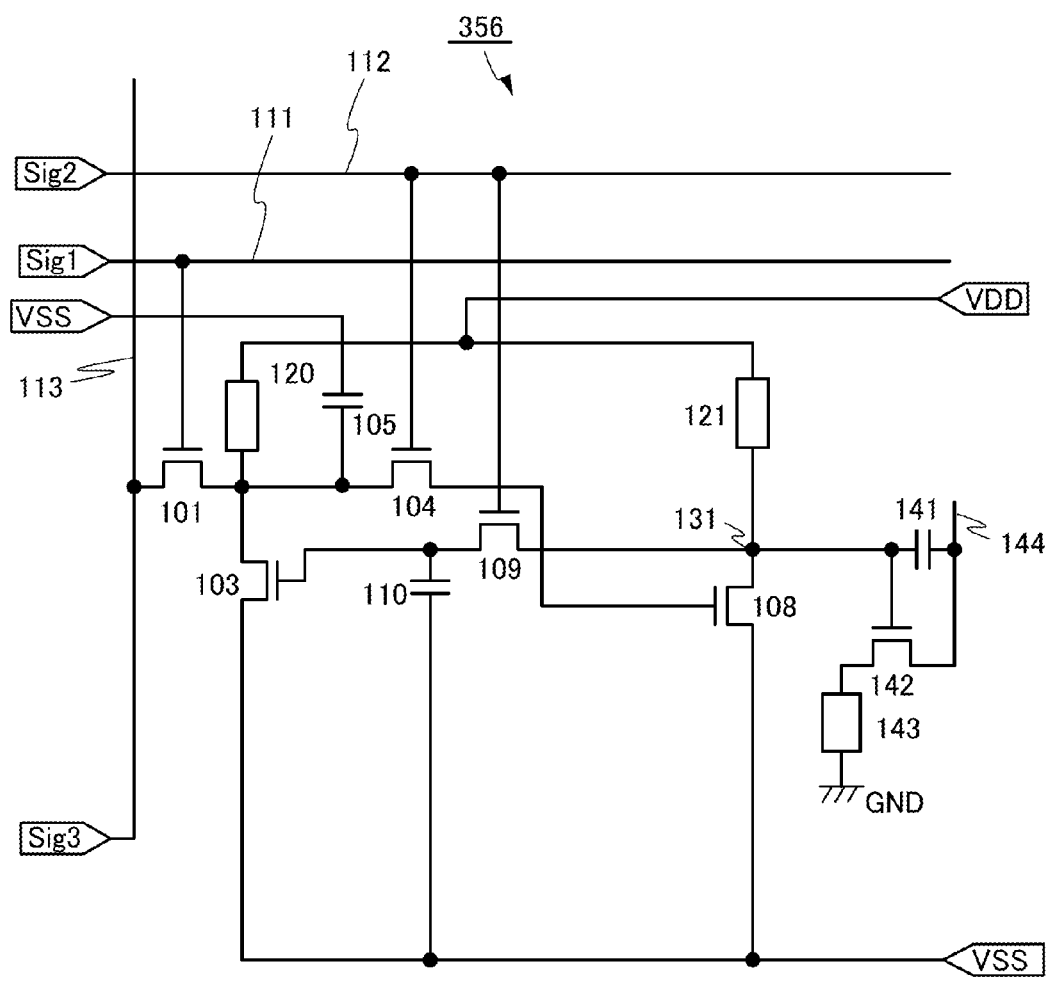
FIG. 10 is a circuit diagram of a semiconductor device.
Figure 11:
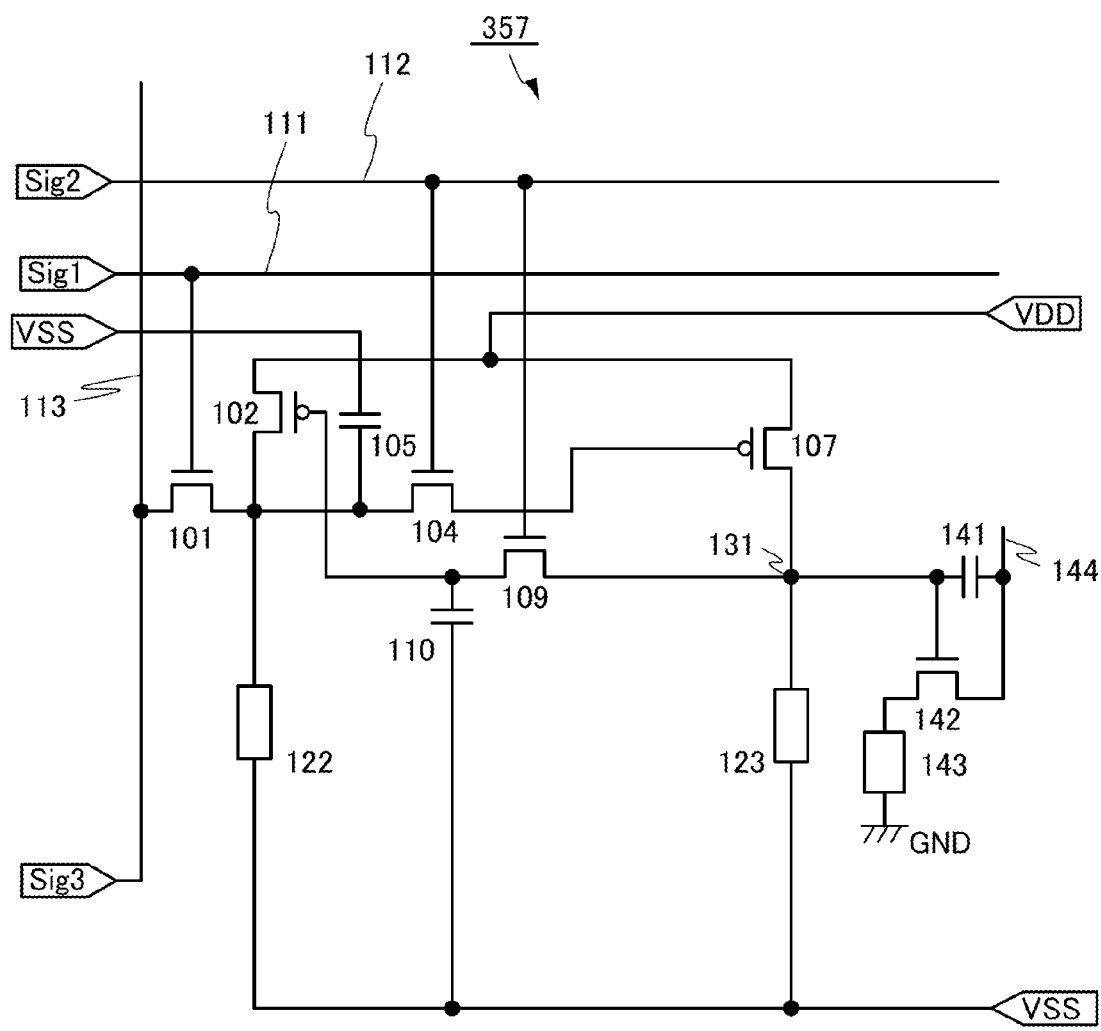
FIG. 11 is a circuit diagram of a semiconductor device.

The operations of the semiconductor device 356 in FIG. 10 and the semiconductor device 357 in FIG. 11 are similar to the operation of the semiconductor device 355 in FIG. 9; therefore, the detailed description is omitted here.

This embodiment can be combined with any other embodiment as appropriate.

Embodiment 3

An oxide semiconductor that can be used for a channel of the transistors in Embodiments 1 and 2 will be described.

A highly purified oxide semiconductor (purified OS) obtained by reduction of impurities such as moisture or hydrogen which serves as an electron donor (donor) and by reduction of oxygen defects is an intrinsic (i-type) semiconductor or a substantially i-type semiconductor. Thus, a transistor including a channel in a highly purified oxide semiconductor has extremely low off-state current and high reliability.

Specifically, various experiments can prove low off-state current of a transistor including a channel in a highly purified oxide semiconductor. For example, the off-state current of even an element having a channel width of $1\times10^6$ μm and a channel length of 10 μm can be less than or equal to the measurement limit of a semiconductor parameter analyzer, that is, less than or equal to $1\times10^{-13}$ A at a voltage between the source electrode and the drain electrode (a drain voltage) of 1 V to 10 V. In this case, it can be seen that off-state current standardized on the channel width of the transistor is lower than or equal to 100 zA/μm. In addition, the off-state current is measured using a circuit in which a capacitor and a transistor are electrically connected to each other and charge flowing into or from the capacitor is controlled by the transistor. In the measurement, a highly purified oxide semiconductor film is used for a channel formation region of the transistor, and the off-state current of the transistor is measured from a change in the amount of charge of the capacitor per unit time. As a result, it is found that when the voltage between the source electrode and the drain electrode of the transistor is 3 V, a lower off-state current of several tens of yoctoamperes per micrometer (yA/μm) is obtained. Consequently, the off-state current of the transistor in which a highly purified oxide semiconductor film is used for a channel formation region is much lower than that of a transistor including crystalline silicon.

Unless otherwise specified, in this specification, the off-state current of an n-channel transistor is a current that flows between a source and a drain when the potential of a gate is lower than or equal to 0 with the potential of the source as a reference potential while the potential of the drain is higher than those of the source and the gate. Moreover, in this specification, the off-state current of a p-channel transistor is a current that flows between a source and a drain when the potential of a gate is higher than or equal to 0 with the potential of the source as a reference potential while the potential of the drain is lower than those of the source and the gate.

An oxide semiconductor preferably contains at least indium (In) or zinc (Zn). The oxide semiconductor preferably contains, in addition to In and Zn, gallium (Ga), tin (Sn), hafnium (Hf), aluminum (Al), and/or zirconium (Zr) that serve as a stabilizer for reducing variations in electric characteristics of transistors using the oxide semiconductor.

Among the oxide semiconductors, unlike silicon carbide, gallium nitride, or gallium oxide, In—Ga—Zn-based oxide, In—Sn—Zn-based oxide, or the like has an advantage of high mass productivity because a transistor with favorable electrical characteristics can be formed by sputtering or a wet process. Further, unlike silicon carbide, gallium nitride, or gallium oxide, with the use of the In—Ga—Zn-based oxide, a transistor with favorable electrical characteristics can be formed over a glass substrate, and a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

Note that, for example, an In—Ga—Zn-based oxide means an oxide containing In, Ga, and Zn and there is no particular limitation on the ratio of In, Ga, and Zn. Further, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Moreover, the In—Ga—Zn-based oxide has high mobility.

For example, an In—Ga—Zn-based oxide with an atomic ratio of In:Ga:Zn=1:1:1 ($=1/3:1/3:1/3$) or In:Ga:Zn=2:2:1 ($=2/5:2/5:1/5$), or an oxide with an atomic ratio close to any of the above atomic ratios can be used. Alternatively, an In—Sn—Zn-based oxide with an atomic ratio of In:Sn:Zn=1:1:1 ($=1/3:1/3:1/3$), In:Sn:Zn=2:1:3 ($=1/3:1/6:1/2$), In:Sn:Zn=2:1:5 ($=1/4:1/8:5/8$) or an oxide with an atomic ratio close to any of the above atomic ratios may be used.

For example, with an In—Sn—Zn-based oxide, high mobility can be achieved relatively easily. However, even with an In—Ga—Zn-based oxide, mobility can be increased by reducing the defect density in the bulk.

A structure of an oxide semiconductor film is described below.

The oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when a CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around 56°. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where the shape of the CAAC-OS film is changed by etching or the like, the c-axis might not be necessarily parallel to a normal vector of a formation surface or a normal vector of a top surface of the CAAC-OS film.

The degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

With the use of the CAAC-OS film in a transistor, change in electric characteristics of the transistor due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For example, the CAAC-OS film is formed by sputtering with a polycrystalline metal oxide sputtering target. By collision of ions with the target, a crystal region included in the target may be separated from the target along an a-b plane; in other words, sputtered particles having a plane parallel to an a-b plane (flat-plate-like sputtered particle or pellet-like sputtered particle) may flake off from the target. In this case, the flat-plate-like sputtered particles reach a substrate while maintaining their crystal state, whereby the CAAC-OS film can be formed.

The CAAC-OS film is preferably deposited under the following conditions.

Decay of the crystal state due to impurities can be prevented by reducing the amount of impurities entering the CAAC-OS film during the deposition, for example, by reducing the concentration of impurities (e.g., hydrogen, water, carbon dioxide, and nitrogen) that exist in the deposition chamber or by reducing the concentration of impurities in a deposition gas. Specifically, a deposition gas with a dew point of −80° C. or lower, preferably −100° C. or lower is used.

By increasing the substrate temperature during the deposition, migration of a sputtered particle is likely to occur after the sputtered particle reaches a substrate surface. Specifically, the substrate temperature during the deposition ranges from 100° C. to 740° C., preferably from 200° C. to 500° C. By increasing the substrate temperature during the deposition, when the flat-plate-like sputtered particle reaches the substrate, migration occurs on the substrate surface; thus, a flat plane of the flat-plate-like sputtered particle is attached to the substrate.

It is preferable that the proportion of oxygen in the deposition gas be increased and the electric power be optimized in order to reduce plasma damage in the deposition. The proportion of oxygen in the deposition gas is 30 vol % or higher, preferably 100 vol %.

As an example of the target, an In—Ga—Zn-based oxide target is described below.

The polycrystalline In—Ga—Zn-based oxide target is made by mixing InO$_X$ powder, GaO$_Y$ powder, and ZnO$_Z$ powder in a predetermined molar ratio, applying pressure, and performing heat treatment at a temperature of 1000° C. to 1500° C. Note that X, Y, and Z are each a given positive number. Here, the predetermined molar ratio of InO$_X$ powder to GaO$_Y$ powder and ZnO$_Z$ powder is, for example, 2:2:1, 8:4:3, 3:1:1, 1:1:1, 4:2:3, or 3:1:2. The kinds of powder and the molar ratio for mixing powder can be determined as appropriate depending on the desired target.

Alkali metal is not an element included in an oxide semiconductor and thus is an impurity. Likewise, alkaline earth metal is an impurity when the alkaline earth metal is not a component of the oxide semiconductor. When an insulating film in contact with an oxide semiconductor layer is an oxide, Na, among the alkali metals, diffuses into the insulating film and becomes Na$^+$. Further, in the oxide semiconductor layer, Na cuts or enters a bond between metal and oxygen which are components of the oxide semiconductor. As a result, the characteristics of the transistor deteriorate, for example, the transistor is placed in a normally-on state due to a negative shift of the threshold voltage or the mobility is decreased. In addition, the characteristics of transistors vary. Specifically, the measurement value of a Na concentration by secondary ion mass spectrometry is preferably $5 \times 10^{16}$ atoms/cm$^3$ or lower, further preferably $1 \times 10^{16}$ atoms/cm$^3$ or lower, still further preferably $1 \times 10^{15}$ atoms/cm$^3$ or lower. Similarly, the measurement value of a Li concentration is preferably $5 \times 10^{15}$ atoms/cm$^3$ or lower, further preferably $1 \times 10^{15}$ atoms/cm$^3$ or lower. Similarly, the measurement value of a K concentration is preferably $5 \times 10^{15}$ atoms/cm$^3$ or lower, further preferably $1 \times 10^{15}$ atoms/cm$^3$ or lower.

When metal oxide containing indium is used, silicon or carbon having higher bond energy with oxygen than indium might cut the bond between indium and oxygen, so that an oxygen vacancy may be formed. Accordingly, when silicon or carbon is contained in the oxide semiconductor layer, the electric characteristics of the transistor are likely to deteriorate as in the case of using alkali metal or alkaline earth metal. Thus, the concentrations of silicon and carbon in the oxide semiconductor layer are preferably low. Specifically, the carbon concentration or the silicon concentration measured by secondary ion mass spectrometry is $1 \times 10^{18}$ atoms/cm$^3$ or lower. In this case, the deterioration of the electric characteristics of the transistor can be prevented, so that the reliability of a semiconductor device can be improved.

A metal in the source electrode and the drain electrode might extract oxygen from the oxide semiconductor layer depending on a conductive material used for the source and drain electrodes. In such a case, a region of the oxide semiconductor layer in contact with the source electrode or the drain electrode becomes an n-type region due to the formation of an oxygen vacancy.

The n-type region serves as a source region or a drain region, resulting in a decrease in the contract resistance between the oxide semiconductor layer and the source electrode or the drain electrode. Accordingly, the formation of the n-type region increases the mobility and on-state current of the transistor, which achieves high-speed operation of a switch circuit using the transistor.

Note that the extraction of oxygen by a metal in the source electrode and the drain electrode is probably caused when the source and drain electrodes are formed by sputtering or when heat treatment is performed after the formation of the source and drain electrodes.

The n-type region is more likely to be formed when the source and drain electrodes are formed using a conductive material that is easily bonded to oxygen. Examples of such a conductive material include Al, Cr, Cu, Ta, Ti, Mo, and W.

The oxide semiconductor layer is not limited to a single-layer metal oxide film and may have a stacked structure of a plurality of metal oxide films. In a semiconductor film in which first to third metal oxide films are sequentially stacked, for example, the first metal oxide film and the third metal oxide film are each an oxide film which contains at least one of the metal elements contained in the second metal oxide film and whose lowest conduction band energy is closer to the vacuum level than that of the second metal oxide film by 0.05 eV or more, 0.07 eV or more, 0.1 eV or more, or 0.15 eV or more and 2 eV or less, 1 eV or less, 0.5 eV or less, or 0.4 eV or less. Further, the second metal oxide film preferably contains at least indium in order to increase the carrier mobility.

In the transistor including the above semiconductor film, when a voltage is applied to the gate electrode so that an electric field is applied to the semiconductor film, a channel region is formed in the second metal oxide film, whose energy at the bottom of the conduction band is the lowest. That is, since the third metal oxide film is provided between the second metal oxide film and a gate insulating film, a channel region can be formed in the second metal oxide film that is insulated from the gate insulating film.

Since the third metal oxide film contains at least one of the metal elements contained in the second metal oxide film, interface scattering is unlikely to occur at the interface between the second metal oxide film and the third metal oxide film. Thus, the movement of carriers is unlikely to be inhibited at the interface, which results in an increase in the field-effect mobility of the transistor.

If an interface level is formed at the interface between the second metal oxide film and the first metal oxide film, a channel region is formed also in the vicinity of the interface, which causes a change in the threshold voltage of the transistor. However, since the first metal oxide film contains at least one of the metal elements contained in the second metal oxide film, an interface level is unlikely to be formed at the interface between the second metal oxide film and the first metal oxide film. Accordingly, the above structure can reduce variations in the electrical characteristics of the transistor, such as the threshold voltage.

Further, it is preferable that a plurality of metal oxide films be stacked so that an interface level due to impurities existing between the metal oxide films, which inhibits carrier flow, is not formed at the interface between the metal oxide films. This is because if impurities exist between the stacked metal oxide films, the continuity of the lowest conduction band energy between the metal oxide films is lost, and carriers are trapped or disappear by recombination in the vicinity of the interface. By reducing impurities existing between the films, a continuous junction (here, particularly a U-shape well structure whose lowest conduction band energy is changed continuously between the films) is formed more easily than the case of merely stacking a plurality of metal oxide films that contain at least one common metal as a main component.

In order to form continuous junction, the films need to be stacked successively without being exposed to the air by using a multi-chamber deposition system (sputtering system) provided with a load lock chamber. Each chamber of the sputtering system is preferably evacuated to a high vacuum (to about $5 \times 10^{-7}$ Pa to $1 \times 10^{-4}$ Pa) by an adsorption vacuum pump such as a cryopump so that water and the like acting as impurities for the oxide semiconductor are removed as much as possible. Alternatively, a combination of a turbo molecular pump and a cold trap is preferably used to prevent back-flow of a gas from an exhaust system into a chamber.

Not only high vacuum evaporation in a chamber but also high purity of a sputtering gas is necessary to obtain a high-purity intrinsic oxide semiconductor. As an oxygen gas or an argon gas used as the sputtering gas, a gas that is highly purified to have a dew point of $-40°$ C. or lower, preferably $-80°$ C. or lower, more preferably $-100°$ C. or lower is used, so that entry of moisture or the like into the oxide semiconductor film can be prevented as much as possible.

For example, the first metal oxide film and/or the third metal oxide film can be an oxide film that contains aluminum, silicon, titanium, gallium, germanium, yttrium, zirconium, tin, lanthanum, cerium, or hafnium at a higher atomic ratio than the second metal oxide film. Specifically, the first metal oxide film and/or the third metal oxide film is preferably an oxide film with a content of any of the above elements 1.5 times or more, preferably 2 times or more, further preferably 3 times or more that of the second metal oxide film in an atomic ratio. The above element is strongly bonded to oxygen and thus has a function of suppressing generation of oxygen vacancies in the oxide film. Accordingly, the first metal oxide film and/or the third metal oxide film can be an oxide layer in which oxygen vacancies are less likely to be generated than in the second metal oxide film.

Specifically, when both the second metal oxide film and the first or third metal oxide film are In-M-Zn-based oxide films and the atomic ratio of the first or third metal oxide film is In:M:Zn=$x_1$:$y_1$:$z_1$ and that of the second metal oxide film is In:M:Zn=$x_2$:$y_2$:$z_2$, the atomic ratios are set so that $y_1/x_1$ is larger than $y_2/x_2$. Note that the element M is a metal element whose bonding strength to oxygen is larger than that of In, and can be Al, Ti, Ga, Y, Zr, Sn, La, Ce, Nd, or Hf, for example. The atomic ratios are preferably set so that $y_1/x_1$ is 1.5 times or more, preferably 2 times or more, further preferably 3 times or more $y_2/x_2$. Here, in the second metal oxide film, $y_2$ is preferably larger than or equal to $x_2$ because the transistor can have stable electrical characteristics. Note that the field-effect mobility of the transistor is reduced when $y_2$ is 3 times or more $x_2$; accordingly, $y_2$ is preferably smaller than 3 times $x_2$.

The thickness of first metal oxide film and the third metal oxide film ranges from 3 nm to 100 nm, preferably from 3 nm to 50 nm. The thickness of the second metal oxide film ranges from 3 nm to 200 nm, preferably from 3 nm to 100 nm, further preferably from 3 nm to 50 nm.

In the three-layer semiconductor film, the first to third metal oxide films can be amorphous or crystalline. Note that the transistor can have stable electrical characteristics when the second metal oxide film where a channel region is formed is crystalline; therefore, the second metal oxide film is preferably crystalline.

Note that a channel formation region refers to a region of a semiconductor film of a transistor that overlaps with a gate electrode and is located between a source electrode and a drain electrode. Further, a channel region refers to a region through which current mainly flows in the channel formation region.

For example, when an In—Ga—Zn-based oxide film formed by sputtering is used as the first and third metal oxide films, a sputtering target that is In—Ga—Zn-based oxide containing In, Ga, and Zn at an atomic ratio of 1:3:2 can be used to deposit the first and third metal oxide films. The deposition conditions can be as follows, for example: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the second metal oxide film is a CAAC-OS film, a sputtering target including polycrystalline In—Ga—Zn-based oxide containing In, Ga, and Zn at an atomic ratio of 1:1:1 is preferably used to deposit the second metal oxide film. The deposition conditions can be as follows, for example: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Note that the end portions of the semiconductor film in the transistor may be tapered or rounded.

Also in the case where a semiconductor film including stacked metal oxide films is used in the transistor, a region in contact with the source electrode or the drain electrode may be an n-type region. Such a structure increases the mobility and on-state current of the transistor and achieves high-speed operation of a semiconductor device. Further, when the semiconductor film including the stacked metal oxide films is used in the transistor, the n-type region particularly preferably reaches the second metal oxide film part of which is to be a channel region, because the mobility and on-state current of the transistor are further increased and higher-speed operation of the semiconductor device is achieved.

Embodiment 4

Figure 12:
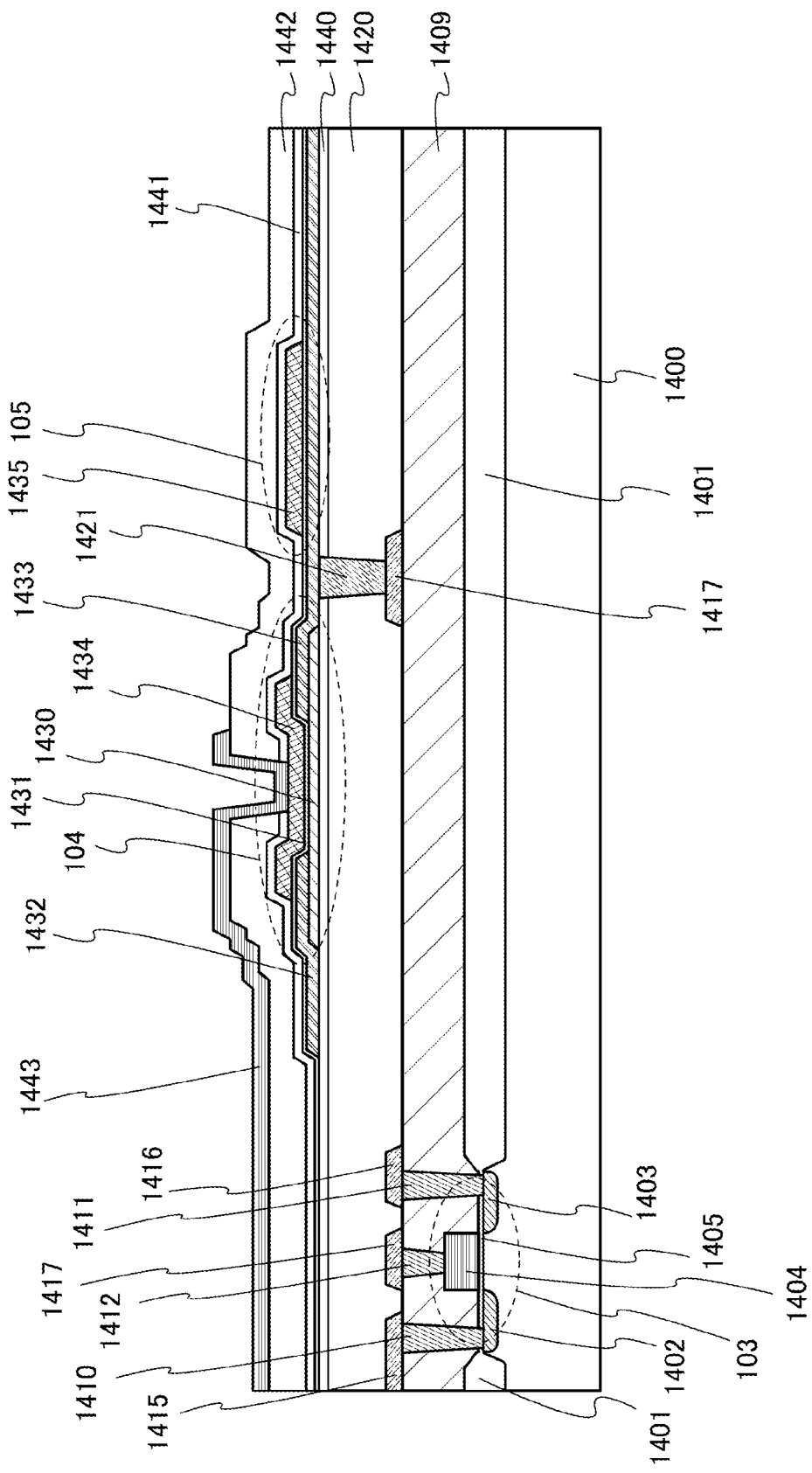
FIG. 12 is a cross-sectional view of a semiconductor device.

An example of the semiconductor devices shown in Embodiments 1 to 3 will be described. FIG. 12 illustrates an example of a cross-sectional structure of the transistor 103, the transistor 104, and the capacitor 105 included in the semiconductor device 300 illustrated in FIGS. 1A and 1B.

The channel of the transistor 104 is included in an oxide semiconductor layer. FIG. 12 shows the case where the transistor 104 and the capacitor 105 are formed over the transistor 103 that has a channel formation region in a single crystal silicon substrate.

Note that an active layer in the transistor 103 can be an amorphous, microcrystalline, polycrystalline, or signal crystal semiconductor film of silicon, germanium, or the like. Alternatively, the transistor 103 may include an active layer containing an oxide semiconductor. In the case where all of the transistors include an active layer containing an oxide semiconductor, the transistor 104 is not necessarily stacked over the transistor 103, and the transistors 103 and 104 may be formed in the same layer.

When the transistor 103 is formed using a thin silicon film, any of the following can be used, for example: amorphous silicon formed by sputtering or vapor phase growth such as plasma-enhanced CVD, polycrystalline silicon obtained by crystallization of amorphous silicon by laser irradiation, and single crystal silicon obtained by separation of a surface portion of a single crystal silicon wafer by implantation of hydrogen ions or the like into the silicon wafer.

Examples of a semiconductor substrate 1400 where the transistor 103 is formed are an n-type or p-type silicon substrate, germanium substrate, silicon germanium substrate, and compound semiconductor substrate (e.g., GaAs substrate, InP substrate, GaN substrate, SiC substrate, GaP substrate, GaInAsP substrate, and ZnSe substrate). As an example, FIG. 12 shows the case where an n-type single crystal silicon substrate is used.

The transistor 103 is electrically isolated from other transistors by an element isolation insulating film 1401. The element isolation insulating film 1401 can be formed by local oxidation of silicon (LOCOS), trench isolation, or the like.

Specifically, the transistor 103 includes impurity regions 1402 and 1403 that are formed in the semiconductor substrate 1400 and function as source and drain regions, a gate electrode 1404, and a gate insulating film 1405 between the semiconductor substrate 1400 and the gate electrode 1404. The gate electrode 1404 overlaps with a channel formation region formed between the impurity regions 1402 and 1403, with the gate insulating film 1405 placed therebetween.

An insulating film 1409 is provided over the transistor 103. Openings are formed in the insulating film 1409. A wiring 1410 in contact with the impurity region 1402, a wiring 1411 in contact with the impurity region 1403, and a wiring 1412 electrically connected to the gate electrode 1404 are formed in the openings.

The wiring 1410 is electrically connected to a wiring 1415 over the insulating film 1409. The wiring 1411 is electrically connected to a wiring 1416 over the insulating film 1409. The wiring 1412 is electrically connected to a wiring 1417 over the insulating film 1409.

An insulating film 1420 and an insulating film 1440 are formed to be stacked in this order over the wirings 1415 to 1417. An opening is formed in the insulating films 1420 and 1440. A wiring 1421 electrically connected to the wiring 1417 is formed in the opening.

In FIG. 12, the transistor 104 and the capacitor 105 are formed over the insulating film 1440.

The transistor 104 includes, over the insulating film 1440, a semiconductor film 1430 containing an oxide semiconductor; conductive films 1432 and 1433 that function as source and drain electrodes and are provided over the semiconductor film 1430; a gate insulating film 1431 over the semiconductor film 1430 and the conductive films 1432 and 1433; and a gate electrode 1434 that is provided over the gate insulating film 1431 and overlaps with the semiconductor film 1430 in the region between the conductive films 1432 and 1433. Note that the conductive film 1433 is electrically connected to the wiring 1421.

A conductive film 1435 is provided over the gate insulating film 1431 to overlap with the conductive film 1433. A portion where the conductive films 1433 and 1435 overlap with each other with the gate insulating film 1431 placed therebetween functions as the capacitor 105.

Although FIG. 12 illustrates an example where the capacitor 105 is provided over the insulating film 1440 together with the transistor 104, the capacitor 105 may be provided below the insulating film 1440 together with the transistor 103.

An insulating film 1441 and an insulating film 1442 are formed to be stacked in this order over the transistor 104 and the capacitor 105. An opening is formed in the insulating films 1441 and 1442. A conductive film 1443 that is in contact with the gate electrode 1434 in the opening is provided over the insulating film 1441.

In FIG. 12, the transistor 104 includes the gate electrode 1434 on at least one side of the semiconductor film 1430. Alternatively, the transistor 104 may include a pair of gate electrodes with the semiconductor film 1430 placed therebetween.

In the case where the transistor 104 has a pair of gate electrodes with the semiconductor film 1430 therebetween, one of the gate electrodes may be supplied with a signal for controlling the on/off state of the transistor 104, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 12, the transistor 104 has a single-gate structure in which one channel formation region corresponding to one gate electrode 1434 is provided. Alternatively, the transistor 104 may have a multi-gate structure in which a plurality of gate electrodes electrically connected to each other are provided and thus a plurality of channel formation regions are included in one active layer.

Figure 13A:
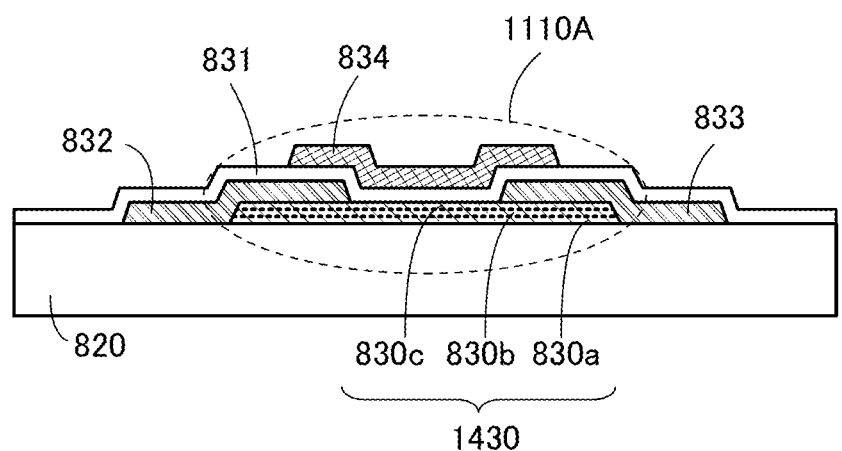
FIGS. 13A and 13B are cross-sectional views of transistors.

The semiconductor film 1430 is not limited to a single film of an oxide semiconductor and may be a stack including a plurality of oxide semiconductor films. FIG. 13A illustrates a structural example of a transistor 1110A in which the semiconductor film 1430 has a three-layer structure.

The transistor 1110A illustrated in FIG. 13A includes the semiconductor film 1430 over an insulating film 820 or the like, conductive films 832 and 833 electrically connected to the semiconductor film 1430, a gate insulating film 831, and a gate electrode 834 provided over the gate insulating film 831 so as to overlap with the semiconductor film 1430.

In the transistor 1110A, as the semiconductor film 1430, oxide semiconductor layers 830a to 830c are stacked in this order from the insulating film 820 side.

The oxide semiconductor layers 830a and 830c are each an oxide film that contains at least one of metal elements contained in the oxide semiconductor layer 830b. The energy at the bottom of the conduction band of the oxide semiconductor layers 830a and 830c is closer to a vacuum level than that of the oxide semiconductor layer 830b by 0.05 eV or more, 0.07 eV or more, 0.1 eV or more, or 0.15 eV or more and 2 eV or less, 1 eV or less, 0.5 eV or less, or 0.4 eV or less. The oxide semiconductor layer 830b preferably contains at least indium in order to increase carrier mobility.

Figure 13B:
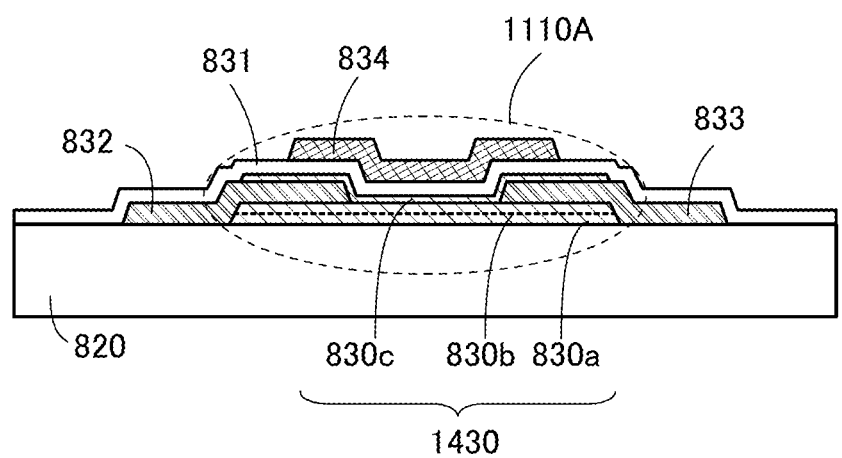

As illustrated in FIG. 13B, the oxide semiconductor layer 830c overlapping with the gate insulating film 831 may be partly provided over the conductive films 832 and 833.

In order to fabricate a liquid crystal display device or an EL display device, a liquid crystal element or an EL element is formed over the insulating film 1442.

Embodiment 5

In this embodiment, a configuration of a CPU, which is a semiconductor device of one embodiment of the present invention, will be described.

Figure 14:
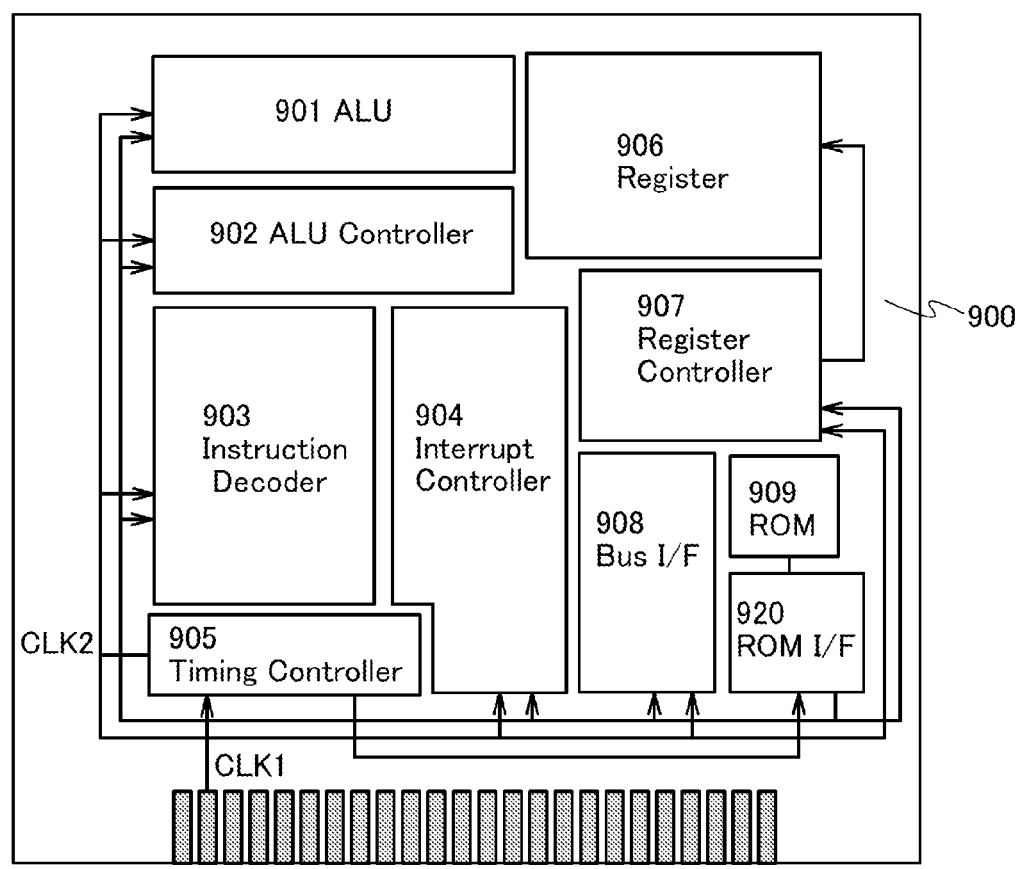
FIG. 14 is a block diagram of a CPU.

FIG. 14 illustrates a configuration of the CPU of this embodiment. The CPU illustrated in FIG. 14 mainly includes, over a substrate 900, an arithmetic logic unit (ALU) 901, an ALU controller 902, an instruction decoder 903, an interrupt controller 904, a timing controller 905, a register 906, a register controller 907, a bus interface (bus I/F) 908, a rewritable ROM 909, and a ROM interface (ROM I/F) 920. The ROM 909 and the ROM I/F 920 may be provided over another chip. The CPU in FIG. 14 is just an example in which the configuration is simplified, and actual CPUs have various configurations according to their intended purpose.

An instruction that is input to the CPU through the bus I/F 908 is input to the instruction decoder 903 and decoded therein, and then, input to the ALU controller 902, the interrupt controller 904, the register controller 907, and the timing controller 905.

The ALU controller 902, the interrupt controller 904, the register controller 907, and the timing controller 905 perform various controls based on the decoded instruction. Specifically, the ALU controller 902 generates signals for controlling the operation of the ALU 901. While the CPU is executing a program, the interrupt controller 904 judges an interrupt request from an external input/output device or a peripheral circuit on the basis of its priority or a mask state, and processes the request. The register controller 907 generates an address of the register 906, and reads/writes data from/to the register 906 in accordance with the state of the CPU.

The timing controller 905 generates signals for controlling operation timings of the ALU 901, the ALU controller 902, the instruction decoder 903, the interrupt controller 904, and the register controller 907. For example, the timing controller 905 is provided with an internal clock generator for generating an internal clock signal CLK2 based on a reference clock signal CLK1, and supplies the clock signal CLK2 to the above circuits.

This embodiment can be combined with any of the above embodiments as appropriate.

Embodiment 6

The semiconductor device of one embodiment of the present invention can be used for display devices, personal computers, and image reproducing devices provided with recording media (typically, devices that reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable information appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 15A to 15F illustrate specific examples of such electronic devices.

Figure 15A:
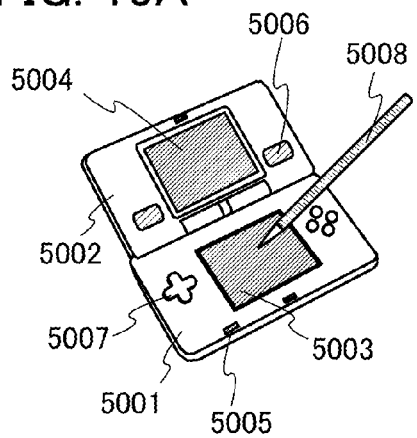
FIGS. 15A to 15F each illustrate an electronic device.

FIG. 15A illustrates a portable game console including a housing 5001, a housing 5002, a display portion 5003, a display portion 5004, a microphone 5005, speakers 5006, a control key 5007, a stylus 5008, and the like. Although the portable game console illustrated in FIG. 15A has the two display portions 5003 and 5004, the number of display portions included in the portable game console is not limited to this.

Figure 15B:
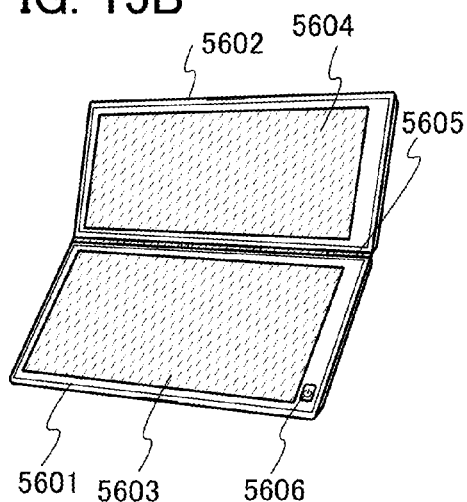

FIG. 15B illustrates a portable information appliance including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by providing a photoelectric conversion element called a photosensor in a pixel area of a display device.

Figure 15C:
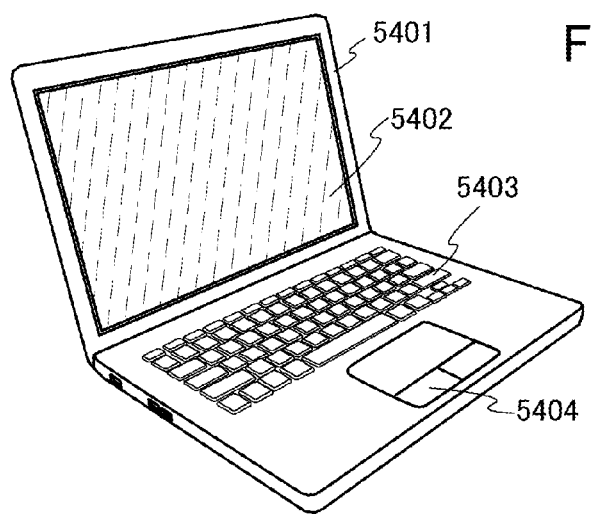

FIG. 15C illustrates a laptop including a housing 5401, a display portion 5402, a keyboard 5403, a pointing device 5404, and the like.

Figure 15D:
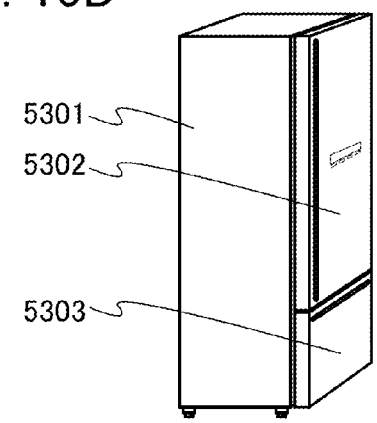

FIG. 15D illustrates an electric refrigerator-freezer including a housing 5301, a refrigerator door 5302, a freezer door 5303, and the like.

Figure 15E:
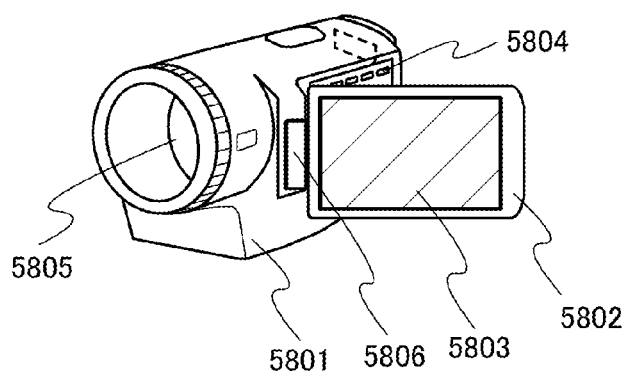

FIG. 15E illustrates a video camera including a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 15F:
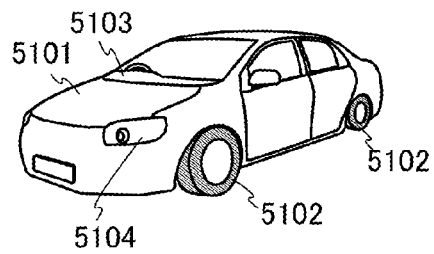

FIG. 15F illustrates a passenger car including a car body 5101, wheels 5102, a dashboard 5103, lights 5104, and the like.

This application is based on Japanese Patent Application serial no. 2013-038083 filed with Japan Patent Office on Feb. 28, 2013, the entire contents of which are hereby incorporated by reference.

What is claimed is:

1. A semiconductor device comprising:
a first transistor, a second transistor, a third transistor, a fourth transistor, a fifth transistor, and a sixth transistor, wherein:
each of the first transistor and the fourth transistor is a p-channel transistor,
each of the second transistor and the fifth transistor is an n-channel transistor,
each of the third transistor and the sixth transistor is a transistor including an oxide semiconductor comprising a channel formation region,
a source of the first transistor and a source of the fourth transistor are configured to be supplied with a high voltage,
a source of the second transistor and a source of the fifth transistor are configured to be supplied with a low voltage,
a drain of the first transistor is directly connected to a drain of the second transistor and a source of the third transistor,
a drain of the third transistor is directly connected to a gate of the fourth transistor and a gate of the fifth transistor,
a drain of the fourth transistor is directly connected to a drain of the fifth transistor and a source of the sixth transistor, and
a drain of the sixth transistor is directly connected to a gate of the first transistor and a gate of the second transistor.

2. The semiconductor device according to claim 1, further comprising:
a seventh transistor and an eighth transistor,
wherein a drain of the seventh transistor is electrically connected to the drain of the first transistor, the drain of the second transistor, and the source of the third transistor, and
wherein a drain of the eighth transistor is electrically connected to the drain of the fourth transistor, the drain of the fifth transistor, and the source of the sixth transistor.

3. The semiconductor device according to claim 1, further comprising:
a liquid crystal element,
wherein one of electrodes of the liquid crystal element is electrically connected to the drain of the fourth transistor, the drain of the fifth transistor, and the source of the sixth transistor.

4. The semiconductor device according to claim 1, further comprising:
a seventh transistor and an EL element,
wherein a gate of the seventh transistor is electrically connected to the drain of the fourth transistor, the drain of the fifth transistor, and the source of the sixth transistor, and
wherein one of electrodes of the EL element is electrically connected to a drain of the seventh transistor.

5. A semiconductor device comprising:
a first transistor, a second transistor, a third transistor, a fourth transistor, a fifth transistor, a sixth transistor, a first capacitor, and a second capacitor,
wherein:
a source of the first transistor and a source of the fourth transistor are configured to be supplied with a high voltage,
a source of the second transistor and a source of the fifth transistor are configured to be supplied with a low voltage,
a drain of the first transistor is directly connected to a drain of the second transistor and a source of the third transistor,
a drain of the third transistor is directly connected to a gate of the fourth transistor and a gate of the fifth transistor, and electrically connected one of electrodes of the first capacitor,
a drain of the fourth transistor is directly connected to a drain of the fifth transistor and a source of the sixth transistor, and
a drain of the sixth transistor is cicctrically directly connected to a gate of the first transistor and a gate of the second transistor, and electrically connected one of electrodes of the second capacitor.

6. The semiconductor device according to claim 5, wherein:
each of the first transistor and the fourth transistor is a p-channel transistor,
each of the second transistor and the fifth transistor is an n-channel transistor, and
each of the third transistor and the sixth transistor is a transistor including an oxide semiconductor comprising a channel formation region.

7. The semiconductor device according to claim 5, further comprising:
a seventh transistor and an eighth transistor,
wherein a drain of the seventh transistor is electrically connected to the drain of the first transistor, the drain of the second transistor, and the source of the third transistor, and
wherein a drain of the eighth transistor is electrically connected to the drain of the fourth transistor, the drain of the fifth transistor, and the source of the sixth transistor.

8. The semiconductor device according to claim 5, further comprising:
a liquid crystal element,
wherein one of electrodes of the liquid crystal element is electrically connected to the drain of the fourth transistor, the drain of the fifth transistor, and the source of the sixth transistor.

9. The semiconductor device according to claim 5, further comprising:
a seventh transistor and an EL element,
wherein a gate of the seventh transistor is electrically connected to the drain of the fourth transistor, the drain of the fifth transistor, and the source of the sixth transistor, and
wherein one of electrodes of the EL element is electrically connected to a drain of the seventh transistor.

* * * * *

UNITED STATES PATENT AND TRADEMARK OFFICE
CERTIFICATE OF CORRECTION

PATENT NO. : 9,581,874 B2  
APPLICATION NO. : 14/190278  
DATED : February 28, 2017  
INVENTOR(S) : Takanori Matsuzaki Page 1 of 1

It is certified that error appears in the above-identified patent and that said Letters Patent is hereby corrected as shown below:

In the Claims

Column 22, Line 55, in Claim 5, remove "cicctrically".

Signed and Sealed this  
First Day of August, 2017

Joseph Matal  
*Performing the Functions and Duties of the*  
*Under Secretary of Commerce for Intellectual Property and*  
*Director of the United States Patent and Trademark Office*